US012786534B2

(12) United States Patent
Patterson et al.

(10) Patent No.: US 12,786,534 B2
(45) Date of Patent: Nov. 3, 2026

(54) LOW PROFILE IMAGE CAPTURE DEVICE WITH A DUAL HEAT EXCHANGER AND CONNECTION MECHANISM

(71) Applicant: GoPro, Inc., San Mateo, CA (US)

(72) Inventors: Jesse Frost Patterson, Pacifica, CA (US); Nicholas Vitale, Foster City, CA (US); Tsz-Ming Lin, Hong Kong (CN); FengXue Cui, Shenzhen (CN)

(73) Assignee: GoPro, Inc., San Mateo, CA (US)

( * ) Notice: Subject to any disclaimer, the term of this patent is extended or adjusted under 35 U.S.C. 154(b) by 129 days.

(21) Appl. No.: 18/738,706

(22) Filed: Jun. 10, 2024

(65) Prior Publication Data

US 2024/0414421 A1 Dec. 12, 2024

Related U.S. Application Data

(60) Provisional application No. 63/612,844, filed on Dec. 20, 2023, provisional application No. 63/472,946,
(Continued)

(51) Int. Cl.
*H04N 23/52* (2023.01)
*G03B 11/04* (2021.01)
(Continued)

(52) U.S. Cl.
CPC .......... *H04N 23/52* (2023.01); *G03B 11/043* (2013.01); *G03B 17/55* (2013.01); *H04N 23/51* (2023.01);
(Continued)

(58) Field of Classification Search
CPC ........ H04N 23/50; H04N 23/51; H04N 23/52; H04N 23/54; H04N 23/55; H04N 23/57; H04N 23/65; G03B 17/55; G03B 30/00; G03B 17/02; G03B 2217/002; G03B 17/14; G03B 17/565; G03B 17/566; G03B 11/043; G03B 2217/007; H05K 1/0201-021; H05K 5/04; H05K 7/2039-20518; H05K 9/00; H05K 9/0007; H05K 9/0024; H05K 9/0026; H05K 9/0049; H05K 9/0058; H05K 9/0081;
(Continued)

(56) References Cited

U.S. PATENT DOCUMENTS 11,637,949 B2 4/2023 Crow
11,689,790 B2 6/2023 Vitale
(Continued)

FOREIGN PATENT DOCUMENTS

CN 115176200 A 10/2022

*Primary Examiner* — Twyler L Haskins
*Assistant Examiner* — Akshay Trehan
(74) *Attorney, Agent, or Firm* — Young Basile Hanlon & MacFarlane, P.C.

(57) ABSTRACT

An image capture apparatus including a monolithic front heatsink, a connection mechanism, and an image sensor and lens assembly (ISLA). The monolithic front heatsink includes a planar surface and a connection mechanism located adjacent to the planar surface. The connection mechanism includes: a protrusion and connection projections extending from the protrusion. The ISLA is coupled to the monolithic front heat sink and a portion of the ISLA extends through the protrusion of the monolithic front heatsink.

20 Claims, 21 Drawing Sheets

Related U.S. Application Data filed on Jun. 14, 2023, provisional application No. 63/472,035, filed on Jun. 9, 2023.

(51) Int. Cl.

| | |
|---|---|
| ***G03B 17/14*** | (2021.01) |
| ***G03B 17/55*** | (2021.01) |
| ***G03B 17/56*** | (2021.01) |
| ***H04M 1/02*** | (2006.01) |
| ***H04N 23/51*** | (2023.01) |
| ***H04N 23/54*** | (2023.01) |
| ***H04N 23/55*** | (2023.01) |
| ***H04N 23/65*** | (2023.01) |
| ***H04R 1/02*** | (2006.01) |
| ***H05K 7/20*** | (2006.01) |

(52) U.S. Cl.

CPC ............. *H04N 23/54* (2023.01); *H04N 23/55* (2023.01); *H04R 1/02* (2013.01); *H05K 7/2039* (2013.01); *G03B 17/14* (2013.01); *G03B 17/565* (2013.01); *G03B 17/566* (2013.01); *G03B 2217/007* (2013.01); *H04M 1/0262* (2013.01); *H04N 23/65* (2023.01)

(58) Field of Classification Search

CPC ... H04R 1/02; H04R 2499/11; H04M 1/0262; H04M 1/0264; G06F 1/1686; B60R 11/04

See application file for complete search history.

(56) References Cited

U.S. PATENT DOCUMENTS

| | | | | |
|---|---|---|---|---|
| 11,796,895 | B2 | 10/2023 | Thomas | |
| 11,846,870 | B2 | 12/2023 | Lim | |
| 2015/0070557 | A1* | 3/2015 | Petty ...................... | G03B 17/55 348/335 |
| 2016/0374190 | A1* | 12/2016 | Tolbert ................... | H04N 23/51 |
| 2020/0037471 | A1* | 1/2020 | Kaga ...................... | H04N 23/52 |
| 2020/0322521 | A1* | 10/2020 | Houjou ................ | A61B 5/0035 |
| 2021/0173167 | A1 | 6/2021 | Cotoros | |
| 2021/0389646 | A1 | 12/2021 | Chen | |
| 2022/0329721 | A1 | 10/2022 | Houjou | |
| 2023/0209166 | A1 | 6/2023 | Vitale | |
| 2024/0073506 | A1 | 2/2024 | Vitale | |

* cited by examiner

LOW PROFILE IMAGE CAPTURE DEVICE WITH A DUAL HEAT EXCHANGER AND CONNECTION MECHANISM

CROSS-REFERENCE TO RELATED APPLICATION(S)

This application claims priority to Chinese Patent Application No. 202421305706.4 filed on Jun. 7, 2024. This application also claims priority to and the benefit of U.S. Provisional Application Patent Ser. Nos. 63/472,035, filed Jun. 9, 2023; 63/472,946, filed Jun. 14, 2023; and 63/612,844, filed Dec. 20, 2023, the entire disclosures of which are hereby incorporated by reference.

TECHNICAL FIELD

This disclosure relates to an image capture device with a reduced size that maintains image capture functionality and waterproofing while including thermal management.

BACKGROUND

Image capture devices have been available to capture images. These image capture devices have been attached to participants to capture events during sporting events or sports from a participant standpoint.

SUMMARY

Disclosed herein are implementations of an image capture apparatus, including a forward housing, a rear housing, and a front heatsink. The forward housing is a forward heatsink. The rear housing is a rear heatsink. The front heatsink houses all or a portion of an integrated sensor and lens assembly (ISLA).

An image capture apparatus including: an integrated sensor and lens assembly (ISLA), a battery bracket, and a battery heat spreader. The battery heat spreader that connects to the integrated sensor of the ISLA at a first end and connects to the battery bracket at a second end so that heat is transferred from the ISLA to the battery bracket.

A method including capturing one or more images or one or more videos. Stabilizing the one or more images or the one or more videos. Adjusting distortion of the one or more images or the one or more video with an umbrella system on chip (SOC). Adjusting the one or more images or the one or more videos vertically, horizontally, or a direction therebetween.

A method including capturing one or more images or one or more videos. Buffering between the one or more images or frames of the one or more videos. Reducing a size of the one or more images or the frames of the one or more videos by a factor of 2, 4, or 6 so that the file size is ½ original size, ¼ original size, or ⅙ original size to generate a reduced file. Generating statistics based on the reduced file.

The present teachings provide an image capture apparatus including a monolithic front heatsink, a connection mechanism, and an image sensor and lens assembly (ISLA). The monolithic front heatsink includes a planar surface and a connection mechanism located adjacent to the planar surface. The connection mechanism includes: a protrusion and connection projections extending from the protrusion. The ISLA is coupled to the monolithic front heat sink and a portion of the ISLA extends through the protrusion of the monolithic front heatsink.

The present teachings provide an image capture apparatus including a front heatsink, an image sensor and lens assembly (ISLA), a removable cover lens, and a battery bracket. The image sensor and lens assembly (ISLA) is connected to and extending from the front heatsink so that the ISLA is fixed within the image capture apparatus relative to the front heatsink. The removable cover lens is removably connected to the front heatsink forward of the ISLA. The battery bracket is in communication with the front heatsink so that thermal energy passes between the front heatsink and a battery that is in communication with the battery bracket.

The present teachings provide a front heatsink. The front heatsink includes mounting flanges, a planar surface, a connection mechanism, a light recess, and a microphone recess.

One of the mounting flanges is a base. The connection mechanism is located adjacent to the planar surface. The connection mechanism has a projection that extends outward from the front heatsink in a direction opposite the mounting flanges. The light recess is located within the planar surface and allows light to pass through or around the front heatsink. The microphone recess is located with the planar surface and located adjacent to the connection mechanism so that sound is passable to a microphone located within the image capture apparatus.

The image capture apparatus taught herein generating images with the methods taught herein.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1A:
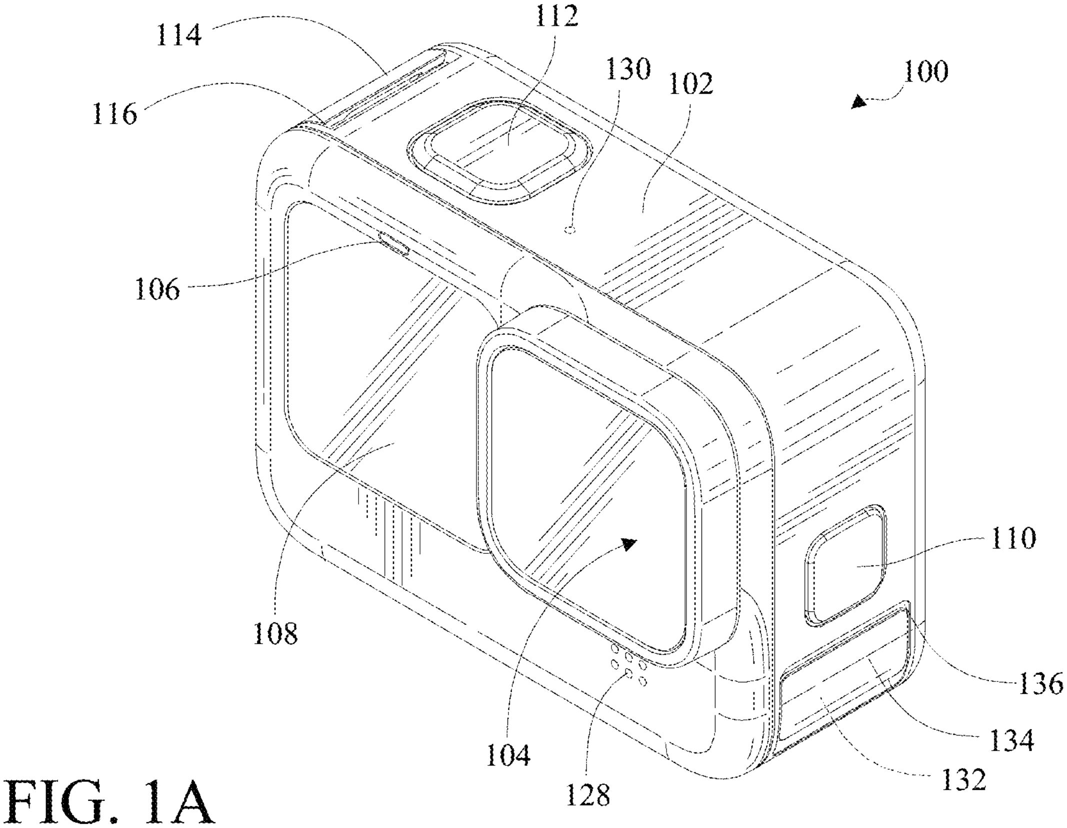
FIGS. 1A-1B are isometric views of an example of an image capture apparatus.

The present teachings relate to an image capture device that has a low profile, reduced volume, or both. The image capture device is thermally balanced by multiple heatsinks, multiple heat spreaders, or a combination of both. The heat spreaders may remove or move heat from one or more heat producing components. The heat spreaders may move or remove heat without affecting optical alignment of an integrated sensor and lens assembly (ISLA). One or more of the heat spreaders may be located opposite a lens cover that assists in sealing the ISLA and protecting lenses of the image capture device. The lens cover may connect to one of the heatsinks that form a portion of forward housing.

The forward housing, the rearward housing, or both may be a heatsink. The forward housing, the rearward housing, or both may assist in blocking radio frequency signals (RF). An internal heatsink may assist in blocking internal RF or in further restricting RF from affecting some of the electrical components of the image capture device. One or more of the heatsinks may include additional RF shielding.

A housing of the image capture device may include one more inputs or buttons. The housing may include six sides and the buttons may be located on any of the six sides. The sides may be a front, back, top, bottom, left side, right side. The buttons may be water resistant or waterproof. The buttons may have a predetermined depression resistance. The buttons may actuate a predetermined distance. The buttons may provide a haptic indication. The buttons may rebound after being depressed. The buttons, speakers, and microphones may all be waterproofed or protected in a similar manner.

The one or more speakers, one or more microphones, or both may be covered by one or more membranes that prevent water from contacting the one or more speakers, the one or more microphones, or both. The membrane may be located between two or more supports, two or more annuluses, or a combination of support and annulus. The supports may be compressible. The annulus may be compressible. Compressibility of the supports and annuluses may be different. The housing in addition to including microphones, speakers, and buttons may include displays.

The displays may be located on any surface. A display may be located on a top surface of the image capture device. Displays may be located on two opposing surface or two adjacent surfaces. The displays may fit between two edges of a surface. The displays may be smaller than a surface. The display may permit users to view an image during capture, after capture, statistics related to the image, properties of the image capture device, or a combination thereof. The image capture apparatus may be entirely free of displays. A display may be located on a single surface of the image capture apparatus.

The statistics may be available during or after an image is processed. The speed of processing may depend on a type of processor used, size of images, frequency of images or videos being taken, how the images are processed, or a combination thereof. The videos, images, or both may be processed as raw data. The images may be compressed before being processed. The images may be resized before being processed. For example, if an image is 100 Mb in size as raw data then the processor may reduce the size to 50 Mb or 25 Mb to process the images in order to have less data to process. The processing of each image or a video file may have a 1 second buffer. The processing may be performed by a CPU. The processing may be down sampled so that the processor may provide statistics in substantially real time (e.g., without delay). The processed images may also be processed to provide image stabilization.

The image processor may electronically adjust for roll, pitch, yaw, or a combination thereof. The image processing may prevent images or videos from being blurry, jittery, bouncing, off axis, or a combination thereof. The image stabilization may provide a correction. The correction may be about five percent vertically, five percent horizontally, or a combination thereof based on a size of an image and/or video file. The image stabilization may be performed by a computer processing unit (CPU). The image stabilization may be performed by an umbrella system on chip (SOC). The image stabilization may be analyzed by the SOC, then an output provided to a CPU that calculates the stabilization, and the CPU provides an output to the hardware to perform the correction.

Figure 1B:
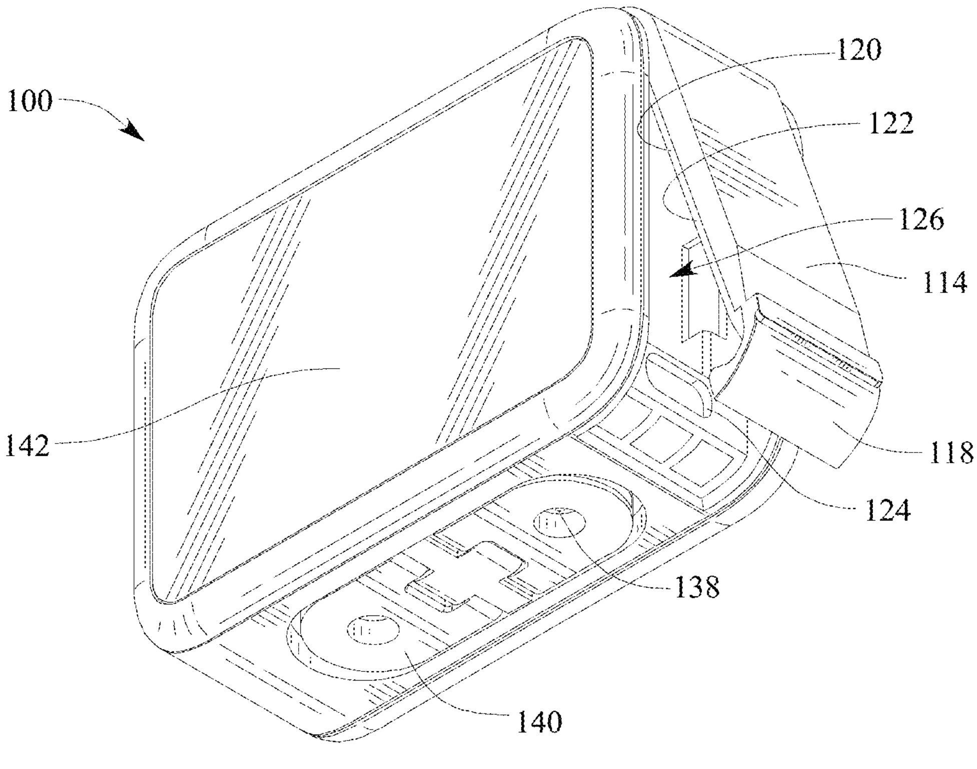
Figure 5:
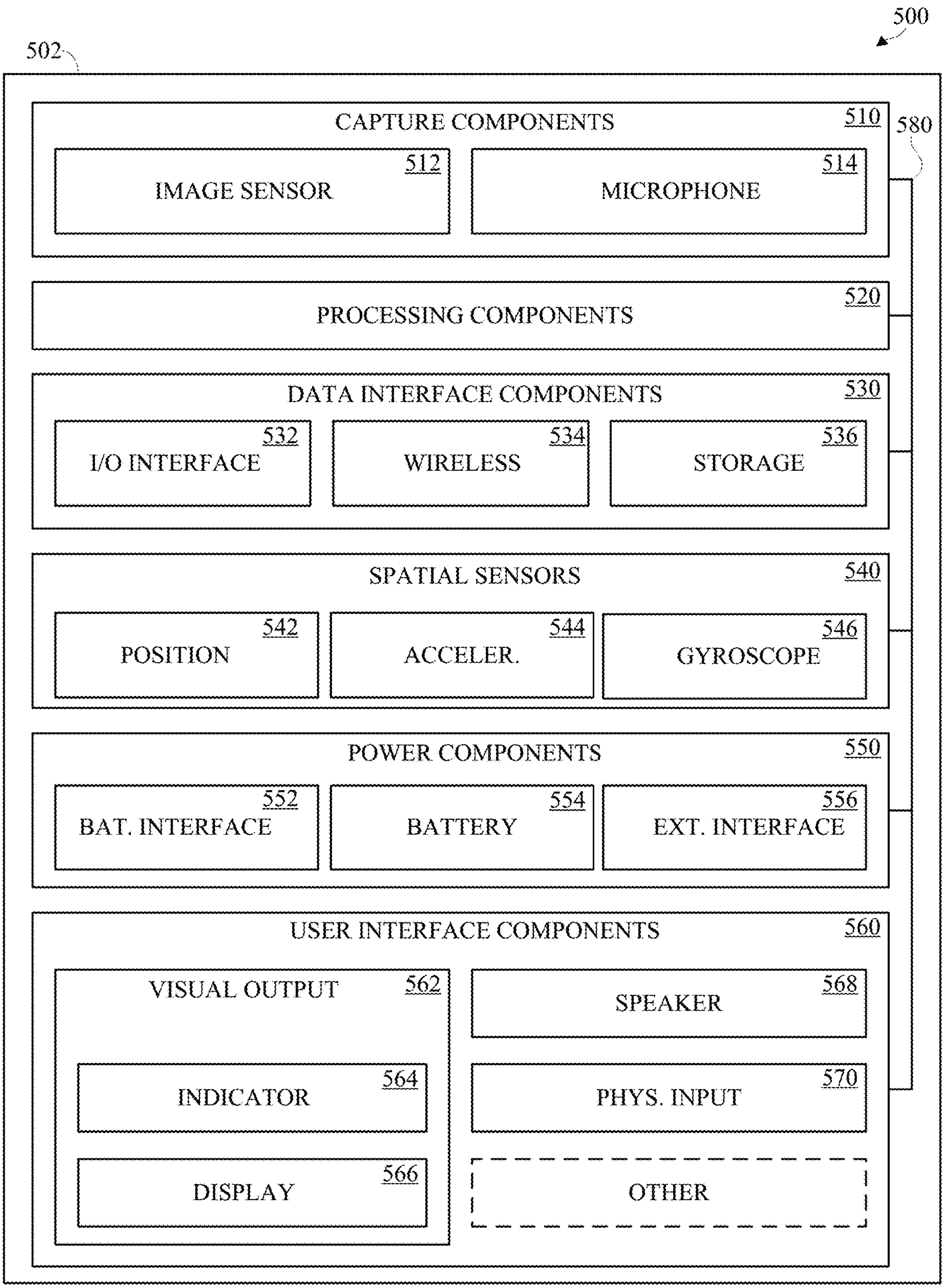
FIG. 5 is a block diagram of electronic components of an image capture apparatus.

FIGS. 1A-1B are isometric views of an example of an image capture apparatus 100. The image capture apparatus 100 includes a body 102, an image capture device 104, an indicator 106, a display 108, a mode button 110, a shutter button 112, a door 114, a hinge mechanism 116, a latch mechanism 118, a seal 120, a battery interface 122, a data interface 124, a battery receptacle 126, microphones 128, 130, 132, a speaker 138, an interconnect mechanism 140, and a display 142. Although not expressly shown in FIGS. 1A-1B, the image capture apparatus 100 includes internal electronics, such as imaging electronics, power electronics, and the like, internal to the body 102 for capturing images and performing other functions of the image capture apparatus 100. An example showing internal electronics is shown in FIG. 5. The arrangement of the components of the image capture apparatus 100 shown in FIGS. 1A-1B is an example, other arrangements of elements may be used, except as is described herein or as is otherwise clear from context.

The body 102 of the image capture apparatus 100 may be made of a rigid material such as plastic, aluminum, steel, or fiberglass. Other materials may be used. The image capture device 104 is structured on a front surface of, and within, the body 102. The image capture device 104 includes a lens. The lens of the image capture device 104 receives light incident upon the lens of the image capture device 104 and directs the received light onto an image sensor of the image capture device 104 internal to the body 102. The image capture apparatus 100 may capture one or more images, such as a sequence of images, such as video. The image capture apparatus 100 may store the captured images and video for subsequent display, playback, or transfer to an external device. Although one image capture device 104 is shown in FIG. 1A, the image capture apparatus 100 may include multiple image capture devices, which may be structured on respective surfaces of the body 102.

As shown in FIG. 1A, the image capture apparatus 100 includes the indicator 106 structured on the front surface of the body 102. The indicator 106 may output, or emit, visible light, such as to indicate a status of the image capture apparatus 100. For example, the indicator 106 may be a light-emitting diode (LED). Although one indicator 106 is shown in FIG. 1A, the image capture apparatus 100 may include multiple indictors structured on respective surfaces of the body 102.

As shown in FIG. 1A, the image capture apparatus 100 includes the display 108 structured on the front surface of the body 102. The display 108 outputs, such as presents or displays, such as by emitting visible light, information, such as to show image information such as image previews, live video capture, or status information such as battery life, camera mode, elapsed time, and the like. In some implementations, the display 108 may be an interactive display, which may receive, detect, or capture input, such as user input representing user interaction with the image capture apparatus 100. In some implementations, the display 108 may be omitted or combined with another component of the image capture apparatus 100.

As shown in FIG. 1A, the image capture apparatus 100 includes the mode button 110 structured on a side surface of the body 102. Although described as a button, the mode button 110 may be another type of input device, such as a switch, a toggle, a slider, or a dial. Although one mode button 110 is shown in FIG. 1A, the image capture apparatus 100 may include multiple mode, or configuration, buttons structured on respective surfaces of the body 102. In some implementations, the mode button 110 may be omitted or combined with another component of the image capture apparatus 100. For example, the display 108 may be an interactive, such as touchscreen, display, and the mode button 110 may be physically omitted and functionally combined with the display 108.

As shown in FIG. 1A, the image capture apparatus 100 includes the shutter button 112 structured on a top surface of the body 102. The shutter button 112 may be another type of input device, such as a switch, a toggle, a slider, or a dial. The image capture apparatus 100 may include multiple shutter buttons structured on respective surfaces of the body 102. In some implementations, the shutter button 112 may be omitted or combined with another component of the image capture apparatus 100.

The mode button 110, the shutter button 112, or both, obtain input data, such as user input data in accordance with user interaction with the image capture apparatus 100. For example, the mode button 110, the shutter button 112, or both, may be used to turn the image capture apparatus 100 on and off, scroll through modes and settings, and select modes and change settings.

As shown in FIG. 1B, the image capture apparatus 100 includes the door 114 coupled to the body 102, such as using the hinge mechanism 116 (FIG. 1A). The door 114 may be secured to the body 102 using the latch mechanism 118 that releasably engages the body 102 at a position generally opposite the hinge mechanism 116. The door 114 includes the seal 120 and the battery interface 122. Although one door 114 is shown in FIG. 1A, the image capture apparatus 100 may include multiple doors respectively forming respective surfaces of the body 102, or portions thereof. The door 114 may be removable from the body 102 by releasing the latch mechanism 118 from the body 102 and decoupling the hinge mechanism 116 from the body 102.

In FIG. 1B, the door 114 is shown in a partially open position such that the data interface 124 is accessible for communicating with external devices and the battery receptacle 126 is accessible for placement or replacement of a battery. In FIG. 1A, the door 114 is shown in a closed position. In implementations in which the door 114 is in the closed position, the seal 120 engages a flange (not shown) to provide an environmental seal and the battery interface 122 engages the battery (not shown) to secure the battery in the battery receptacle 126.

As shown in FIG. 1B, the image capture apparatus 100 includes the battery receptacle 126 structured to form a portion of an interior surface of the body 102. The battery receptacle 126 includes operative connections for power transfer between the battery and the image capture apparatus 100. In some implementations, the battery receptacle 126 may be omitted. The image capture apparatus 100 may include multiple battery receptacles.

As shown in FIG. 1A, the image capture apparatus 100 includes a first microphone 128 structured on a front surface of the body 102, a second microphone 130 structured on a top surface of the body 102, and a third microphone 132 structured on a side surface of the body 102. The third microphone 132, which may be referred to as a drain microphone and is indicated as hidden in dotted line, is located behind a drain cover 134, surrounded by a drain channel 136, and can drain liquid from audio components of the image capture apparatus 100. The image capture apparatus 100 may include other microphones on other surfaces of the body 102. The microphones 128, 130, 132 receive and record audio, such as in conjunction with capturing video or separate from capturing video. In some implementations, one or more of the microphones 128, 130, 132 may be omitted or combined with other components of the image capture apparatus 100.

As shown in FIG. 1B, the image capture apparatus 100 includes the speaker 138 structured on a bottom surface of the body 102. The speaker 138 outputs or presents audio, such as by playing back recorded audio or emitting sounds associated with notifications. The image capture apparatus 100 may include multiple speakers structured on respective surfaces of the body 102.

As shown in FIG. 1B, the image capture apparatus 100 includes the interconnect mechanism 140 structured on a bottom surface of the body 102. The interconnect mechanism 140 removably connects the image capture apparatus 100 to an external structure, such as a handle grip, another mount, or a securing device. The interconnect mechanism 140 includes folding protrusions configured to move between a nested or collapsed position as shown in FIG. 1B and an extended or open position. The folding protrusions of the interconnect mechanism 140 in the extended or open position may be coupled to reciprocal protrusions of other devices such as handle grips, mounts, clips, or like devices. The image capture apparatus 100 may include multiple interconnect mechanisms structured on, or forming a portion of, respective surfaces of the body 102. In some implementations, the interconnect mechanism 140 may be omitted.

As shown in FIG. 1B, the image capture apparatus 100 includes the display 142 structured on, and forming a portion of, a rear surface of the body 102. The display 142 outputs, such as presents or displays, such as by emitting visible light, data, such as to show image information such as image previews, live video capture, or status information such as battery life, camera mode, elapsed time, and the like. In some implementations, the display 142 may be an interactive display, which may receive, detect, or capture input, such as user input representing user interaction with the image capture apparatus 100. The image capture apparatus 100 may include multiple displays structured on respective surfaces of the body 102, such as the displays 108, 142 shown in FIGS. 1A-1B. In some implementations, the display 142 may be omitted or combined with another component of the image capture apparatus 100.

The image capture apparatus 100 may include features or components other than those described herein, such as other buttons or interface features. In some implementations, interchangeable lenses, cold shoes, and hot shoes, or a combination thereof, may be coupled to or combined with the image capture apparatus 100. For example, the image capture apparatus 100 may communicate with an external device, such as an external user interface device, via a wired or wireless computing communication link, such as via the data interface 124. The computing communication link may be a direct computing communication link or an indirect computing communication link, such as a link including another device or a network, such as the Internet. The image capture apparatus 100 may transmit images to the external device via the computing communication link.

The external device may store, process, display, or combination thereof, the images. The external user interface device may be a computing device, such as a smartphone, a tablet computer, a smart watch, a portable computer, personal computing device, or another device or combination of devices configured to receive user input, communicate information with the image capture apparatus 100 via the computing communication link, or receive user input and communicate information with the image capture apparatus 100 via the computing communication link. The external user interface device may implement or execute one or more applications to manage or control the image capture apparatus 100. For example, the external user interface device may include an application for controlling camera configuration, video acquisition, video display, or any other configurable or controllable aspect of the image capture apparatus 100. In some implementations, the external user interface device may generate and share, such as via a cloud-based or social media service, one or more images or video clips. In some implementations, the external user interface device may display unprocessed or minimally processed images or video captured by the image capture apparatus 100 contemporaneously with capturing the images or video by the image capture apparatus 100, such as for shot framing or live preview.

Figure 2A:
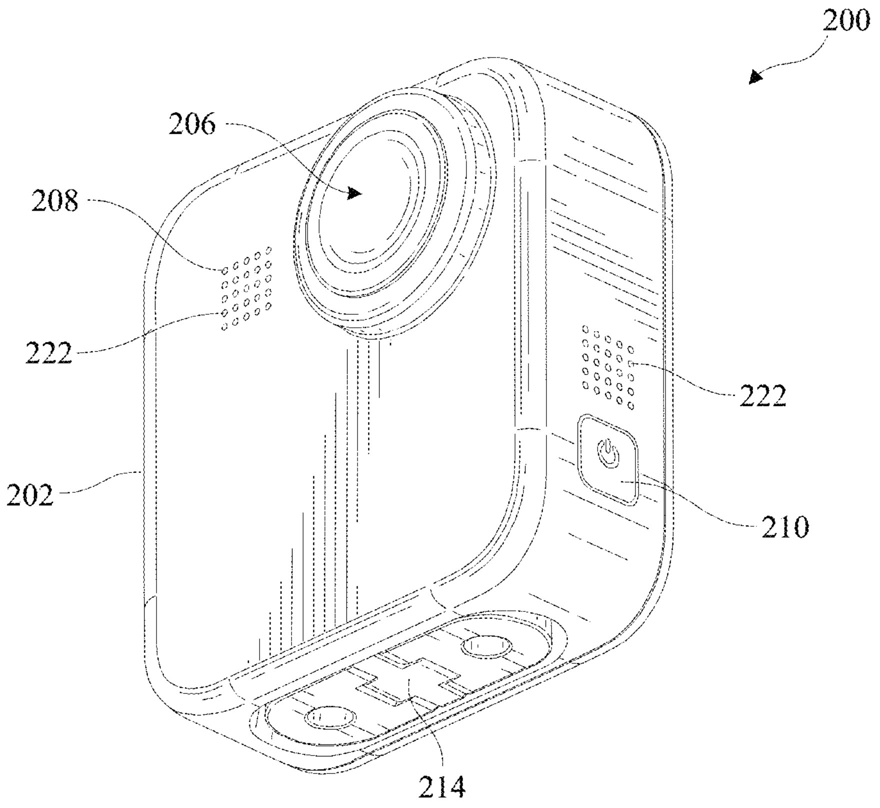
FIGS. 2A-2B are isometric views of another example of an image capture apparatus.
Figure 2B:
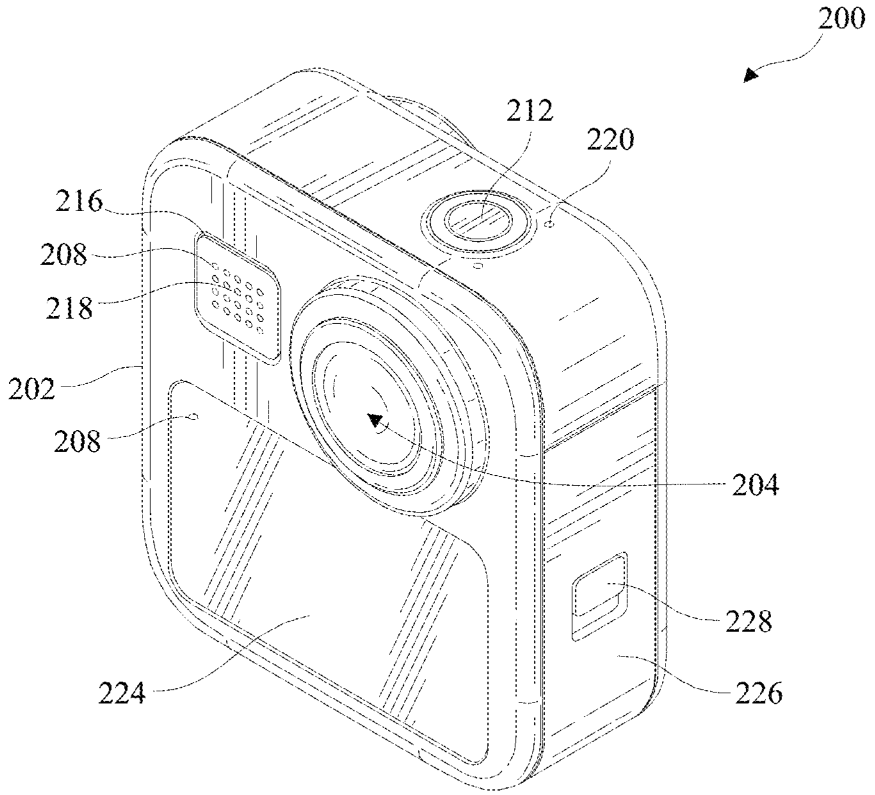

FIGS. 2A-2B illustrate another example of an image capture apparatus 200. The image capture apparatus 200 is similar to the image capture apparatus 100 shown in FIGS. 1A-1B. The image capture apparatus 200 includes a body 202, a first image capture device 204, a second image capture device 206, indicators 208, a mode button 210, a shutter button 212, an interconnect mechanism 214, a drainage channel 216, audio components 218, 220, 222, a display 224, and a door 226 including a release mechanism 228. The arrangement of the components of the image capture apparatus 200 shown in FIGS. 2A-2B is an example, other arrangements of elements may be used.

The body 202 of the image capture apparatus 200 may be similar to the body 102 shown in FIGS. 1A-1B. The first image capture device 204 is structured on a front surface of the body 202. The first image capture device 204 includes a first lens. The first image capture device 204 may be similar to the image capture device 104 shown in FIG. 1A. As shown in FIG. 2A, the image capture apparatus 200 includes the second image capture device 206 structured on a rear surface of the body 202. The second image capture device 206 includes a second lens. The second image capture device 206 may be similar to the image capture device 104 shown in FIG. 1A. The image capture devices 204, 206 are disposed on opposing surfaces of the body 202, for example, in a back-to-back configuration, Janus configuration, or offset Janus configuration. The image capture apparatus 200 may include other image capture devices structured on respective surfaces of the body 202.

As shown in FIG. 2B, the image capture apparatus 200 includes the indicators 208 associated with the audio component 218 and the display 224 on the front surface of the body 202. The indicators 208 may be similar to the indicator 106 shown in FIG. 1A. For example, one of the indicators 208 may indicate a status of the first image capture device 204 and another one of the indicators 208 may indicate a status of the second image capture device 206. Although two indicators 208 are shown in FIGS. 2A-2B, the image capture apparatus 200 may include other indictors structured on respective surfaces of the body 202.

As shown in FIGS. 2A-2B, the image capture apparatus 200 includes input mechanisms including the mode button 210, structured on a side surface of the body 202, and the shutter button 212, structured on a top surface of the body 202. The mode button 210 may be similar to the mode button 110 shown in FIG. 1B. The shutter button 212 may be similar to the shutter button 112 shown in FIG. 1A.

The image capture apparatus 200 includes internal electronics (not expressly shown), such as imaging electronics, power electronics, and the like, internal to the body 202 for capturing images and performing other functions of the image capture apparatus 200. An example showing internal electronics is shown in FIG. 5.

As shown in FIGS. 2A-2B, the image capture apparatus 200 includes the interconnect mechanism 214 structured on a bottom surface of the body 202. The interconnect mechanism 214 may be similar to the interconnect mechanism 140 shown in FIG. 1B.

As shown in FIG. 2B, the image capture apparatus 200 includes the drainage channel 216 for draining liquid from audio components of the image capture apparatus 200.

As shown in FIGS. 2A-2B, the image capture apparatus 200 includes the audio components 218, 220, 222, respectively structured on respective surfaces of the body 202. The audio components 218, 220, 222 may be similar to the microphones 128, 130, 132 and the speaker 138 shown in FIGS. 1A-1B. One or more of the audio components 218, 220, 222 may be, or may include, audio sensors, such as microphones, to receive and record audio signals, such as voice commands or other audio, in conjunction with capturing images or video. One or more of the audio components 218, 220, 222 may be, or may include, an audio presentation component that may present, or play, audio, such as to provide notifications or alerts.

As shown in FIGS. 2A-2B, a first audio component 218 is located on a front surface of the body 202, a second audio component 220 is located on a top surface of the body 202, and a third audio component 222 is located on a back surface of the body 202. Other numbers and configurations for the audio components 218, 220, 222 may be used. For example, the audio component 218 may be a drain microphone surrounded by the drainage channel 216 and adjacent to one of the indicators 208 as shown in FIG. 2B.

As shown in FIG. 2B, the image capture apparatus 200 includes the display 224 structured on a front surface of the body 202. The display 224 may be similar to the displays 108, 142 shown in FIGS. 1A-1B. The display 224 may include an I/O interface. The display 224 may include one or more of the indicators 208. The display 224 may receive touch inputs. The display 224 may display image information during video capture. The display 224 may provide status information to a user, such as status information indicating battery power level, memory card capacity, time elapsed for a recorded video, etc. The image capture apparatus 200 may include multiple displays structured on respective surfaces of the body 202. In some implementations, the display 224 may be omitted or combined with another component of the image capture apparatus 200.

As shown in FIG. 2B, the image capture apparatus 200 includes the door 226 structured on, or forming a portion of, the side surface of the body 202. The door 226 may be similar to the door 114 shown in FIG. 1A. For example, the door 226 shown in FIG. 2A includes a release mechanism 228. The release mechanism 228 may include a latch, a button, or other mechanism configured to receive a user input that allows the door 226 to change position. The release mechanism 228 may be used to open the door 226 for a user to access a battery, a battery receptacle, an I/O interface, a memory card interface, etc.

In some embodiments, the image capture apparatus 200 may include features or components other than those described herein, some features or components described herein may be omitted, or some features or components described herein may be combined. For example, the image capture apparatus 200 may include additional interfaces or different interface features, interchangeable lenses, cold shoes, or hot shoes.

Figure 3:
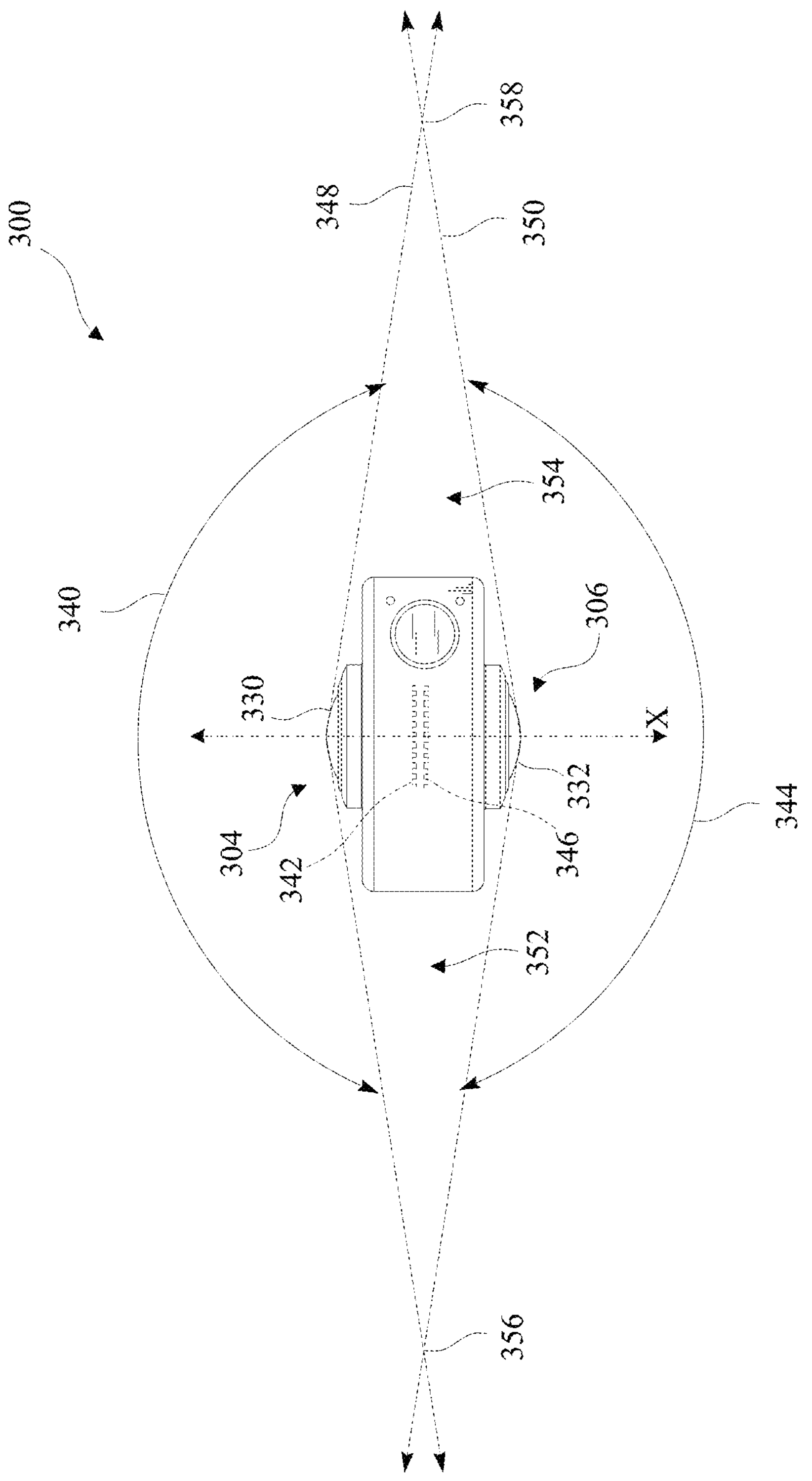
FIG. 3 is a top view of another example of an image capture apparatus.

FIG. 3 is a top view of an image capture apparatus 300. The image capture apparatus 300 is similar to the image capture apparatus 200 of FIGS. 2A-2B and is configured to capture spherical images.

As shown in FIG. 3, a first image capture device 304 includes a first lens 330 and a second image capture device 306 includes a second lens 332. For example, the first image capture device 304 may capture a first image, such as a first hemispheric, or hyper-hemispherical, image, the second image capture device 306 may capture a second image, such as a second hemispheric, or hyper-hemispherical, image, and the image capture apparatus 300 may generate a spherical image incorporating or combining the first image and the second image, which may be captured concurrently, or substantially concurrently.

The first image capture device 304 defines a first field-of-view 340 wherein the first lens 330 of the first image capture device 304 receives light. The first lens 330 directs the received light corresponding to the first field-of-view 340 onto a first image sensor 342 of the first image capture device 304. For example, the first image capture device 304 may include a first lens barrel (not expressly shown), extending from the first lens 330 to the first image sensor 342.

The second image capture device 306 defines a second field-of-view 344 wherein the second lens 332 receives light. The second lens 332 directs the received light corresponding to the second field-of-view 344 onto a second image sensor 346 of the second image capture device 306. For example, the second image capture device 306 may include a second lens barrel (not expressly shown), extending from the second lens 332 to the second image sensor 346.

A boundary 348 of the first field-of-view 340 is shown using broken directional lines. A boundary 350 of the second field-of-view 344 is shown using broken directional lines. As shown, the image capture devices 304, 306 are arranged in a back-to-back (Janus) configuration such that the lenses 330, 332 face in opposite directions, and such that the image capture apparatus 300 may capture spherical images. The first image sensor 342 captures a first hyper-hemispherical image plane from light entering the first lens 330. The second image sensor 346 captures a second hyper-hemispherical image plane from light entering the second lens 332.

As shown in FIG. 3, the fields-of-view 340, 344 partially overlap such that the combination of the fields-of-view 340, 344 forms a spherical field-of-view, except that one or more uncaptured areas 352, 354 may be outside of the fields-of-view 340, 344 of the lenses 330, 332. Light emanating from or passing through the uncaptured areas 352, 354, which may be proximal to the image capture apparatus 300, may be obscured from the lenses 330, 332 and the corresponding image sensors 342, 346, such that content corresponding to the uncaptured areas 352, 354 may be omitted from images captured by the image capture apparatus 300. In some implementations, the image capture devices 304, 306, or the lenses 330, 332 thereof, may be configured to minimize the uncaptured areas 352, 354.

Examples of points of transition, or overlap points, from the uncaptured areas 352, 354 to the overlapping portions of the fields-of-view 340, 344 are shown at 356, 358.

Images contemporaneously captured by the respective image sensors 342, 346 may be combined to form a combined image, such as a spherical image. Generating a combined image may include correlating the overlapping regions captured by the respective image sensors 342, 346, aligning the captured fields-of-view 340, 344, and stitching the images together to form a cohesive combined image. Stitching the images together may include correlating the overlap points 356, 358 with respective locations in corresponding images captured by the image sensors 342, 346. Although a planar view of the fields-of-view 340, 344 is shown in FIG. 3, the fields-of-view 340, 344 are hyper-hemispherical.

A change in the alignment, such as position, tilt, or a combination thereof, of the image capture devices 304, 306, such as of the lenses 330, 332, the image sensors 342, 346, or both, may change the relative positions of the respective fields-of-view 340, 344, may change the locations of the overlap points 356, 358, such as with respect to images captured by the image sensors 342, 346, and may change the uncaptured areas 352, 354, which may include changing the uncaptured areas 352, 354 unequally.

Incomplete or inaccurate information indicating the alignment of the image capture devices 304, 306, such as the locations of the overlap points 356, 358, may decrease the accuracy, efficiency, or both of generating a combined image. In some implementations, the image capture apparatus 300 may maintain information indicating the location and orientation of the image capture devices 304, 306, such as of the lenses 330, 332, the image sensors 342, 346, or both, such that the fields-of-view 340, 344, the overlap points 356, 358, or both may be accurately determined, which may improve the accuracy, efficiency, or both of generating a combined image.

The lenses 330, 332 may be aligned along an axis X as shown, laterally offset from each other (not shown), off-center from a central axis of the image capture apparatus 300 (not shown), or laterally offset and off-center from the central axis (not shown). Whether through use of offset or through use of compact image capture devices 304, 306, a reduction in distance between the lenses 330, 332 along the axis X may improve the overlap in the fields-of-view 340, 344, such as by reducing the uncaptured areas 352, 354.

Images or frames captured by the image capture devices 304, 306 may be combined, merged, or stitched together to produce a combined image, such as a spherical or panoramic image, which may be an equirectangular planar image. In some implementations, generating a combined image may include use of techniques such as noise reduction, tone mapping, white balancing, or other image correction. In some implementations, pixels along a stitch boundary, which may correspond with the overlap points 356, 358, may be matched accurately to minimize boundary discontinuities.

Figure 4A:
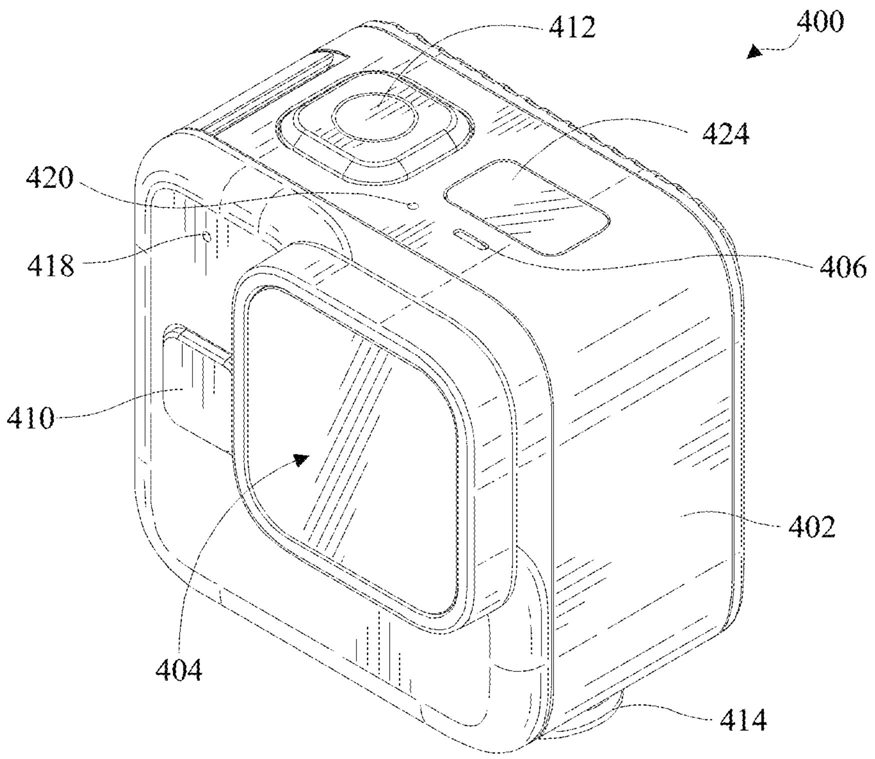
FIGS. 4A-4B are isometric views of another example of an image capture apparatus.
Figure 4B:
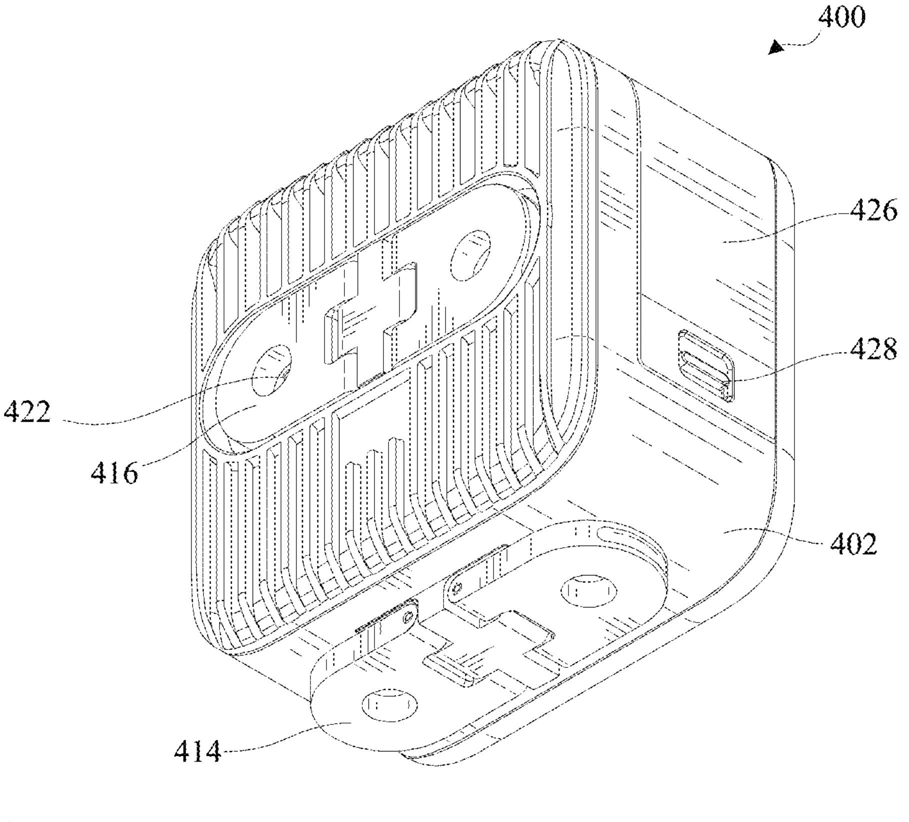

FIGS. 4A-4B illustrate another example of an image capture apparatus 400. The image capture apparatus 400 is similar to the image capture apparatus 100 shown in FIGS. 1A-1B and to the image capture apparatus 200 shown in FIGS. 2A-2B. The image capture apparatus 400 includes a body 402, an image capture device 404, an indicator 406, a mode button 410, a shutter button 412, interconnect mechanisms 414, 416, audio components 418, 420, 422, a display 424, and a door 426 including a release mechanism 428. The arrangement of the components of the image capture apparatus 400 shown in FIGS. 4A-4B is an example, other arrangements of elements may be used.

The body 402 of the image capture apparatus 400 may be similar to the body 102 shown in FIGS. 1A-1B. The image capture device 404 is structured on a front surface of the body 402. The image capture device 404 includes a lens and may be similar to the image capture device 104 shown in FIG. 1A.

As shown in FIG. 4A, the image capture apparatus 400 includes the indicator 406 on a top surface of the body 402. The indicator 406 may be similar to the indicator 106 shown in FIG. 1A. The indicator 406 may indicate a status of the image capture device 204. Although one indicator 406 is shown in FIGS. 4A, the image capture apparatus 400 may include other indictors structured on respective surfaces of the body 402.

As shown in FIGS. 4A, the image capture apparatus 400 includes input mechanisms including the mode button 410, structured on a front surface of the body 402, and the shutter button 412, structured on a top surface of the body 402. The mode button 410 may be similar to the mode button 110 shown in FIG. 1B. The shutter button 412 may be similar to the shutter button 112 shown in FIG. 1A.

The image capture apparatus 400 includes internal electronics (not expressly shown), such as imaging electronics, power electronics, and the like, internal to the body 402 for capturing images and performing other functions of the image capture apparatus 400. An example showing internal electronics is shown in FIG. 5.

As shown in FIGS. 4A-4B, the image capture apparatus 400 includes the interconnect mechanisms 414, 416, with a first interconnect mechanism 414 structured on a bottom surface of the body 402 and a second interconnect mechanism 416 disposed within a rear surface of the body 402. The interconnect mechanisms 414, 416 may be similar to the interconnect mechanism 140 shown in FIG. 1B and the interconnect mechanism 214 shown in FIG. 2A.

As shown in FIGS. 4A-4B, the image capture apparatus 400 includes the audio components 418, 420, 422 respectively structured on respective surfaces of the body 402. The audio components 418, 420, 422 may be similar to the microphones 128, 130, 132 and the speaker 138 shown in FIGS. 1A-1B. One or more of the audio components 418, 420, 422 may be, or may include, audio sensors, such as microphones, to receive and record audio signals, such as voice commands or other audio, in conjunction with capturing images or video. One or more of the audio components 418, 420, 422 may be, or may include, an audio presentation component that may present, or play, audio, such as to provide notifications or alerts.

As shown in FIGS. 4A-4B, a first audio component 418 is located on a front surface of the body 402, a second audio component 420 is located on a top surface of the body 402, and a third audio component 422 is located on a rear surface of the body 402. Other numbers and configurations for the audio components 418, 420, 422 may be used.

As shown in FIG. 4A, the image capture apparatus 400 includes the display 424 structured on a front surface of the body 402. The display 424 may be similar to the displays 108, 142 shown in FIGS. 1A-1B. The display 424 may include an I/O interface. The display 424 may receive touch inputs. The display 424 may display image information during video capture. The display 424 may provide status information to a user, such as status information indicating battery power level, memory card capacity, time elapsed for a recorded video, etc. The image capture apparatus 400 may include multiple displays structured on respective surfaces of the body 402. In some implementations, the display 424 may be omitted or combined with another component of the image capture apparatus 200.

As shown in FIG. 4B, the image capture apparatus 400 includes the door 426 structured on, or forming a portion of, the side surface of the body 402. The door 426 may be similar to the door 226 shown in FIG. 2B. The door 426 shown in FIG. 4B includes the release mechanism 428. The release mechanism 428 may include a latch, a button, or other mechanism configured to receive a user input that allows the door 426 to change position. The release mechanism 428 may be used to open the door 426 for a user to access a battery, a battery receptacle, an I/O interface, a memory card interface, etc.

In some embodiments, the image capture apparatus 400 may include features or components other than those described herein, some features or components described herein may be omitted, or some features or components described herein may be combined. For example, the image capture apparatus 400 may include additional interfaces or different interface features, interchangeable lenses, cold shoes, or hot shoes.

FIG. 5 is a block diagram of electronic components in an image capture apparatus 500. The image capture apparatus 500 may be a single-lens image capture device, a multi-lens image capture device, or variations thereof, including an image capture apparatus with multiple capabilities such as the use of interchangeable integrated sensor lens assemblies. Components, such as electronic components, of the image capture apparatus 100 shown in FIGS. 1A-B, the image capture apparatus 200 shown in FIGS. 2A-B, the image capture apparatus 300 shown in FIG. 3, or the image capture apparatus 400 shown in FIGS. 4A-4B, may be implemented as shown in FIG. 5.

The image capture apparatus 500 includes a body 502. The body 502 may be similar to the body 102 shown in FIGS. 1A-1B, the body 202 shown in FIGS. 2A-2B, or the body 402 shown in FIGS. 4A-4B. The body 502 includes electronic components such as capture components 510, processing components 520, data interface components 530, spatial sensors 540, power components 550, user interface components 560, and a bus 580.

The capture components 510 include an image sensor 512 for capturing images. Although one image sensor 512 is shown in FIG. 5, the capture components 510 may include multiple image sensors. The image sensor 512 may be similar to the image sensors 342, 346 shown in FIG. 3. The image sensor 512 may be, for example, a charge-coupled device (CCD) sensor, an active pixel sensor (APS), a complementary metal-oxide-semiconductor (CMOS) sensor, or an N-type metal-oxide-semiconductor (NMOS) sensor. The image sensor 512 detects light, such as within a defined spectrum, such as the visible light spectrum or the infrared spectrum, incident through a corresponding lens such as the first lens 330 with respect to the first image sensor 342 or the second lens 332 with respect to the second image sensor 346 as shown in FIG. 3. The image sensor 512 captures detected light as image data and conveys the captured image data as electrical signals (image signals or image data) to the other components of the image capture apparatus 500, such as to the processing components 520, such as via the bus 580.

The capture components 510 include a microphone 514 for capturing audio. Although one microphone 514 is shown in FIG. 5, the capture components 510 may include multiple microphones. The microphone 514 detects and captures, or records, sound, such as sound waves incident upon the microphone 514. The microphone 514 may detect, capture, or record sound in conjunction with capturing images by the image sensor 512. The microphone 514 may detect sound to receive audible commands to control the image capture apparatus 500. The microphone 514 may be similar to the microphones 128, 130, 132 shown in FIGS. 1A-1B, the audio components 218, 220, 222 shown in FIGS. 2A-2B, or the audio components 418, 420, 422 shown in FIGS. 4A-4B.

The processing components 520 perform image signal processing, such as filtering, tone mapping, or stitching, to generate, or obtain, processed images, or processed image data, based on image data obtained from the image sensor 512. The processing components 520 may include one or more processors having single or multiple processing cores. In some implementations, the processing components 520 may include, or may be, an application specific integrated circuit (ASIC) or a digital signal processor (DSP). For example, the processing components 520 may include a custom image signal processor. The processing components 520 conveys data, such as processed image data, with other components of the image capture apparatus 500 via the bus 580. In some implementations, the processing components 520 may include an encoder, such as an image or video encoder that may encode, decode, or both, the image data, such as for compression coding, transcoding, or a combination thereof.

Although not shown expressly in FIG. 5, the processing components 520 may include memory, such as a random-access memory (RAM) device, which may be non-transitory computer-readable memory. The memory of the processing components 520 may include executable instructions and data that can be accessed by the processing components 520.

The data interface components 530 communicates with other, such as external, electronic devices, such as a remote control, a smartphone, a tablet computer, a laptop computer, a desktop computer, or an external computer storage device. For example, the data interface components 530 may receive commands to operate the image capture apparatus 500. In another example, the data interface components 530 may transmit image data to transfer the image data to other electronic devices. The data interface components 530 may be configured for wired communication, wireless communication, or both. As shown, the data interface components 530 include an I/O interface 532, a wireless data interface 534, and a storage interface 536. In some implementations, one or more of the I/O interface 532, the wireless data interface 534, or the storage interface 536 may be omitted or combined.

The I/O interface 532 may send, receive, or both, wired electronic communications signals. For example, the I/O interface 532 may be a universal serial bus (USB) interface, such as USB type-C interface, a high-definition multimedia interface (HDMI), a FireWire interface, a digital video interface link, a display port interface link, a Video Electronics Standards Associated (VESA) digital display interface link, an Ethernet link, or a Thunderbolt link. Although one I/O interface 532 is shown in FIG. 5, the data interface components 530 include multiple I/O interfaces. The I/O interface 532 may be similar to the data interface 124 shown in FIG. 1B.

The wireless data interface 534 may send, receive, or both, wireless electronic communications signals. The wireless data interface 534 may be a Bluetooth interface, a ZigBee interface, a Wi-Fi interface, an infrared link, a cellular link, a near field communications (NFC) link, or an Advanced Network Technology interoperability (ANT+) link. Although one wireless data interface 534 is shown in FIG. 5, the data interface components 530 include multiple wireless data interfaces. The wireless data interface 534 may be similar to the data interface 124 shown in FIG. 1B.

The storage interface 536 may include a memory card connector, such as a memory card receptacle, configured to receive and operatively couple to a removable storage device, such as a memory card, and to transfer, such as read, write, or both, data between the image capture apparatus 500 and the memory card, such as for storing images, recorded audio, or both captured by the image capture apparatus 500 on the memory card. Although one storage interface 536 is shown in FIG. 5, the data interface components 530 include multiple storage interfaces. The storage interface 536 may be similar to the data interface 124 shown in FIG. 1B.

The spatial, or spatiotemporal, sensors 540 detect the spatial position, movement, or both, of the image capture apparatus 500. As shown in FIG. 5, the spatial sensors 540 include a position sensor 542, an accelerometer 544, and a gyroscope 546. The position sensor 542, which may be a global positioning system (GPS) sensor, may determine a geospatial position of the image capture apparatus 500, which may include obtaining, such as by receiving, temporal data, such as via a GPS signal. The accelerometer 544, which may be a three-axis accelerometer, may measure linear motion, linear acceleration, or both of the image capture apparatus 500. The gyroscope 546, which may be a three-axis gyroscope, may measure rotational motion, such as a rate of rotation, of the image capture apparatus 500. In some implementations, the spatial sensors 540 may include other types of spatial sensors. In some implementations, one or more of the position sensor 542, the accelerometer 544, and the gyroscope 546 may be omitted or combined.

The power components 550 distribute electrical power to the components of the image capture apparatus 500 for operating the image capture apparatus 500. As shown in FIG. 5, the power components 550 include a battery interface 552, a battery 554, and an external power interface 556 (ext. interface). The battery interface 552 (bat. interface) operatively couples to the battery 554, such as via conductive contacts to transfer power from the battery 554 to the other electronic components of the image capture apparatus 500. The battery interface 552 may be similar to the battery receptacle 126 shown in FIG. 1B. The external power interface 556 obtains or receives power from an external source, such as a wall plug or external battery, and distributes the power to the components of the image capture apparatus 500, which may include distributing power to the battery 554 via the battery interface 552 to charge the battery 554. Although one battery interface 552, one battery 554, and one external power interface 556 are shown in FIG. 5, any number of battery interfaces, batteries, and external power interfaces may be used. In some implementations, one or more of the battery interface 552, the battery 554, and the external power interface 556 may be omitted or combined. For example, in some implementations, the external power interface 556 and the I/O interface 532 may be combined.

The user interface components 560 receive input, such as user input, from a user of the image capture apparatus 500, output, such as display or present, information to a user, or both receive input and output information, such as in accordance with user interaction with the image capture apparatus 500.

As shown in FIG. 5, the user interface components 560 include visual output components 562 to visually communicate information, such as to present captured images. As shown, the visual output components 562 include an indicator 564 and a display 566. The indicator 564 may be similar to the indicator 106 shown in FIG. 1A, the indicators 208 shown in FIGS. 2A-2B, or the indicator 406 shown in FIG. 4A. The display 566 may be similar to the display 108 shown in FIG. 1A, the display 142 shown in FIG. 1B, the display 224 shown in FIG. 2B, or the display 424 shown in FIG. 4A. Although the visual output components 562 are shown in FIG. 5 as including one indicator 564, the visual output components 562 may include multiple indicators. Although the visual output components 562 are shown in FIG. 5 as including one display 566, the visual output components 562 may include multiple displays. In some implementations, one or more of the indicator 564 or the display 566 may be omitted or combined.

As shown in FIG. 5, the user interface components 560 include a speaker 568. The speaker 568 may be similar to the speaker 138 shown in FIG. 1B, the audio components 218, 220, 222 shown in FIGS. 2A-2B, or the audio components 418, 420, 422 shown in FIGS. 4A-4B. Although one speaker 568 is shown in FIG. 5, the user interface components 560 may include multiple speakers. In some implementations, the speaker 568 may be omitted or combined with another component of the image capture apparatus 500, such as the microphone 514.

As shown in FIG. 5, the user interface components 560 include a physical input interface 570. The physical input interface 570 may be similar to the mode buttons 110, 210, 410 shown in FIGS. 1A, 2A, and 4A or the shutter buttons 112, 212, 412 shown in FIGS. 1A, 2B, and 4A. Although one physical input interface 570 is shown in FIG. 5, the user interface components 560 may include multiple physical input interfaces. In some implementations, the physical input interface 570 may be omitted or combined with another component of the image capture apparatus 500. The physical input interface 570 may be, for example, a button, a toggle, a switch, a dial, or a slider.

As shown in FIG. 5, the user interface components 560 include a broken line border box labeled "other" to indicate that components of the image capture apparatus 500 other than the components expressly shown as included in the user interface components 560 may be user interface components. For example, the microphone 514 may receive, or capture, and process audio signals to obtain input data, such as user input data corresponding to voice commands. In another example, the image sensor 512 may receive, or capture, and process image data to obtain input data, such as user input data corresponding to visible gesture commands. In another example, one or more of the spatial sensors 540, such as a combination of the accelerometer 544 and the gyroscope 546, may receive, or capture, and process motion data to obtain input data, such as user input data corresponding to motion gesture commands.

Figure 6:
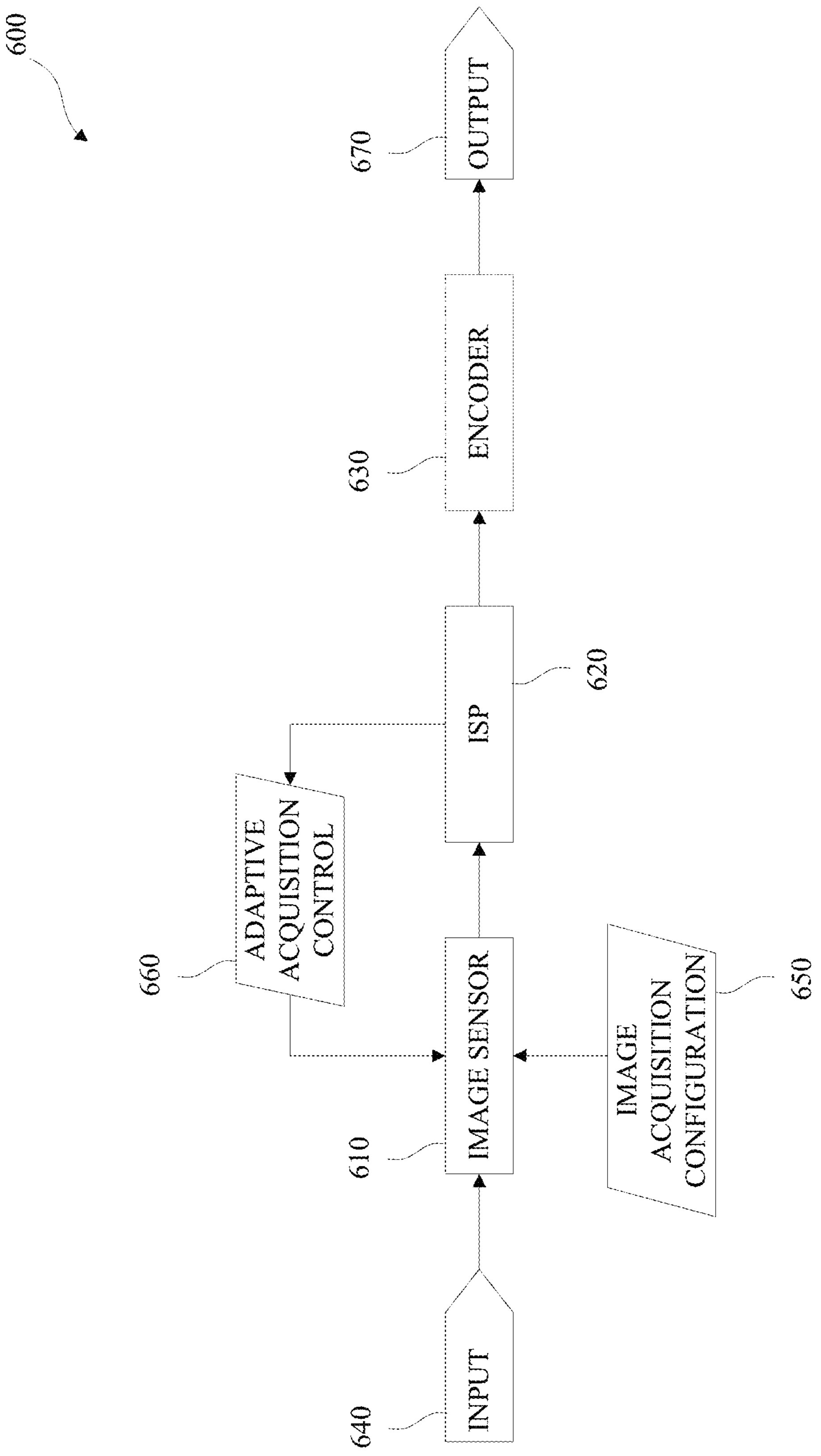
FIG. 6 is a flow diagram of an example of an image processing pipeline.

FIG. 6 is a block diagram of an example of an image processing pipeline 600. The image processing pipeline 600, or a portion thereof, is implemented in an image capture apparatus, such as the image capture apparatus 100 shown in FIGS. 1A-1B, the image capture apparatus 200 shown in FIGS. 2A-2B, the image capture apparatus 300 shown in FIG. 3, the image capture apparatus 400 shown in FIGS. 4A-4B, or another image capture apparatus. In some implementations, the image processing pipeline 600 may be implemented in a digital signal processor (DSP), an application-specific integrated circuit (ASIC), or a combination of a digital signal processor and an application-specific integrated circuit. One or more components of the pipeline 600 may be implemented in hardware, software, or a combination of hardware and software.

As shown in FIG. 6, the image processing pipeline 600 includes an image sensor 610, an image signal processor (ISP) 620, and an encoder 630. The encoder 630 is shown with a broken line border to indicate that the encoder may be omitted, or absent, from the image processing pipeline 600. In some implementations, the encoder 630 may be included in another device. In implementations that include the encoder 630, the image processing pipeline 600 may be an image processing and coding pipeline. The image processing pipeline 600 may include components other than the components shown in FIG. 6.

The image sensor 610 receives input 640, such as photons incident on the image sensor 610. The image sensor 610 captures image data (source image data). Capturing source image data includes measuring or sensing the input 640, which may include counting, or otherwise measuring, photons incident on the image sensor 610, such as for a defined temporal duration or period (exposure). Capturing source image data includes converting the analog input 640 to a digital source image signal in a defined format, which may be referred to herein as "a raw image signal." For example, the raw image signal may be in a format such as RGB format, which may represent individual pixels using a combination of values or components, such as a red component (R), a green component (G), and a blue component (B). In another example, the raw image signal may be in a Bayer format, wherein a respective pixel may be one of a combination of adjacent pixels, such as a combination of four adjacent pixels, of a Bayer pattern.

Although one image sensor 610 is shown in FIG. 6, the image processing pipeline 600 may include two or more image sensors. In some implementations, an image, or frame, such as an image, or frame, included in the source image signal, may be one of a sequence or series of images or frames of a video, such as a sequence, or series, of frames captured at a rate, or frame rate, which may be a number or cardinality of frames captured per defined temporal period, such as twenty-four, thirty, sixty, or one-hundred twenty frames per second.

The image sensor 610 obtains image acquisition configuration data 650. The image acquisition configuration data 650 may include image cropping parameters, binning/skipping parameters, pixel rate parameters, bitrate parameters, resolution parameters, framerate parameters, or other image acquisition configuration data or combinations of image acquisition configuration data. Obtaining the image acquisition configuration data 650 may include receiving the image acquisition configuration data 650 from a source other than a component of the image processing pipeline 600. For example, the image acquisition configuration data 650, or a portion thereof, may be received from another component, such as a user interface component, of the image capture apparatus implementing the image processing pipeline 600, such as one or more of the user interface components 560 shown in FIG. 5. The image sensor 610 obtains, outputs, or both, the source image data in accordance with the image acquisition configuration data 650. For example, the image sensor 610 may obtain the image acquisition configuration data 650 prior to capturing the source image.

The image sensor 610 receives, or otherwise obtains or accesses, adaptive acquisition control data 660, such as auto exposure (AE) data, auto white balance (AWB) data, global tone mapping (GTM) data, Auto Color Lens Shading (ACLS) data, color correction data, or other adaptive acquisition control data or combination of adaptive acquisition control data. For example, the image sensor 610 receives the adaptive acquisition control data 660 from the image signal processor 620. The image sensor 610 obtains, outputs, or both, the source image data in accordance with the adaptive acquisition control data 660.

The image sensor 610 controls, such as configures, sets, or modifies, one or more image acquisition parameters or settings, or otherwise controls the operation of the image signal processor 620, in accordance with the image acquisition configuration data 650 and the adaptive acquisition control data 660. For example, the image sensor 610 may capture a first source image using, or in accordance with, the image acquisition configuration data 650, and in the absence of adaptive acquisition control data 660 or using defined values for the adaptive acquisition control data 660, output the first source image to the image signal processor 620, obtain adaptive acquisition control data 660 generated using the first source image data from the image signal processor 620, and capture a second source image using, or in accordance with, the image acquisition configuration data 650 and the adaptive acquisition control data 660 generated using the first source image. In an example, the adaptive acquisition control data 660 may include an exposure duration value and the image sensor 610 may capture an image in accordance with the exposure duration value.

The image sensor 610 outputs source image data, which may include the source image signal, image acquisition data, or a combination thereof, to the image signal processor 620.

The image signal processor 620 receives, or otherwise accesses or obtains, the source image data from the image sensor 610. The image signal processor 620 processes the source image data to obtain input image data. In some implementations, the image signal processor 620 converts the raw image signal (RGB data) to another format, such as a format expressing individual pixels using a combination of values or components, such as a luminance, or luma, value (Y), a blue chrominance, or chroma, value (U or Cb), and a red chroma value (V or Cr), such as the YUV or YCbCr formats.

Processing the source image data includes generating the adaptive acquisition control data 660. The adaptive acquisition control data 660 includes data for controlling the acquisition of a one or more images by the image sensor 610.

The image signal processor 620 includes components not expressly shown in FIG. 6 for obtaining and processing the source image data. For example, the image signal processor 620 may include one or more sensor input (SEN) components (not shown), one or more sensor readout (SRO) components (not shown), one or more image data compression components, one or more image data decompression components, one or more internal memory, or data storage, components, one or more Bayer-to-Bayer (B2B) components, one or more local motion estimation (LME) components, one or more local motion compensation (LMC) components, one or more global motion compensation (GMC) components, one or more Bayer-to-RGB (B2R) components, one or more image processing units (IPU), one or more high dynamic range (HDR) components, one or more three-dimensional noise reduction (3DNR) components, one or more sharpening components, one or more raw-to-YUV (R2Y) components, one or more Chroma Noise Reduction (CNR) components, one or more local tone mapping (LTM) components, one or more YUV-to-YUV (Y2Y) components, one or more warp and blend components, one or more stitching cost components, one or more scaler components, or a configuration controller. The image signal processor 620, or respective components thereof, may be implemented in hardware, software, or a combination of hardware and software. Although one image signal processor 620 is shown in FIG. 6, the image processing pipeline 600 may include multiple image signal processors. In implementations that include multiple image signal processors, the functionality of the image signal processor 620 may be divided or distributed among the image signal processors.

In some implementations, the image signal processor 620 may implement or include multiple parallel, or partially parallel paths for image processing. For example, for high dynamic range image processing based on two source images, the image signal processor 620 may implement a first image processing path for a first source image and a second image processing path for a second source image, wherein the image processing paths may include components that are shared among the paths, such as memory components, and may include components that are separately included in each path, such as a first sensor readout component in the first image processing path and a second sensor readout component in the second image processing path, such that image processing by the respective paths may be performed in parallel, or partially in parallel.

The image signal processor 620, or one or more components thereof, such as the sensor input components, may perform black-point removal for the image data. In some implementations, the image sensor 610 may compress the source image data, or a portion thereof, and the image signal processor 620, or one or more components thereof, such as one or more of the sensor input components or one or more of the image data decompression components, may decompress the compressed source image data to obtain the source image data.

The image signal processor 620, or one or more components thereof, such as the sensor readout components, may perform dead pixel correction for the image data. The sensor readout component may perform scaling for the image data.

The sensor readout component may obtain, such as generate or determine, adaptive acquisition control data, such as auto exposure data, auto white balance data, global tone mapping data, Auto Color Lens Shading data, or other adaptive acquisition control data, based on the source image data.

The image signal processor 620, or one or more components thereof, such as the image data compression components, may obtain the image data, or a portion thereof, such as from another component of the image signal processor 620, compress the image data, and output the compressed image data, such as to another component of the image signal processor 620, such as to a memory component of the image signal processor 620.

The image signal processor 620, or one or more components thereof, such as the image data decompression, or uncompression, components (UCX), may read, receive, or otherwise access, compressed image data and may decompress, or uncompress, the compressed image data to obtain image data. In some implementations, other components of the image signal processor 620 may request, such as send a request message or signal, the image data from an uncompression component, and, in response to the request, the uncompression component may obtain corresponding compressed image data, uncompress the compressed image data to obtain the requested image data, and output, such as send or otherwise make available, the requested image data to the component that requested the image data. The image signal processor 620 may include multiple uncompression components, which may be respectively optimized for uncompression with respect to one or more defined image data formats.

The image signal processor 620, or one or more components thereof, such as the internal memory, or data storage, components. The memory components store image data, such as compressed image data internally within the image signal processor 620 and are accessible to the image signal processor 620, or to components of the image signal processor 620. In some implementations, a memory component may be accessible, such as write accessible, to a defined component of the image signal processor 620, such as an image data compression component, and the memory component may be accessible, such as read accessible, to another defined component of the image signal processor 620, such as an uncompression component of the image signal processor 620.

The image signal processor 620, or one or more components thereof, such as the Bayer-to-Bayer components, which may process image data, such as to transform or convert the image data from a first Bayer format, such as a signed 15-bit Bayer format data, to second Bayer format, such as an unsigned 14-bit Bayer format. The Bayer-to-Bayer components may obtain, such as generate or determine, high dynamic range Tone Control data based on the current image data.

Although not expressly shown in FIG. 6, in some implementations, a respective Bayer-to-Bayer component may include one or more sub-components. For example, the Bayer-to-Bayer component may include one or more gain components. In another example, the Bayer-to-Bayer component may include one or more offset map components, which may respectively apply respective offset maps to the image data. The respective offset maps may have a configurable size, which may have a maximum size, such as 129×129. The respective offset maps may have a non-uniform grid. Applying the offset map may include saturation management, which may preserve saturated areas on respective images based on R, G, and B values. The values of the offset map may be modified per-frame and double buffering may be used for the map values. A respective offset map component may, such as prior to Bayer noise removal (denoising), compensate for non-uniform black point removal, such as due to non-uniform thermal heating of the sensor or image capture device. A respective offset map component may, such as subsequent to Bayer noise removal, compensate for flare, such as flare on hemispherical lenses, and/or may perform local contrast enhancement, such a dehazing or local tone mapping.

In another example, the Bayer-to-Bayer component may include a Bayer Noise Reduction (Bayer NR) component, which may convert image data, such as from a first format, such as a signed 15-bit Bayer format, to a second format, such as an unsigned 14-bit Bayer format. In another example, the Bayer-to-Bayer component may include one or more lens shading (FSHD) component, which may, respectively, perform lens shading correction, such as luminance lens shading correction, color lens shading correction, or both. In some implementations, a respective lens shading component may perform exposure compensation between two or more sensors of a multi-sensor image capture apparatus, such as between two hemispherical lenses. In some implementations, a respective lens shading component may apply map-based gains, radial model gain, or a combination, such as a multiplicative combination, thereof. In some implementations, a respective lens shading component may perform saturation management, which may preserve saturated areas on respective images. Map and lookup table values for a respective lens shading component may be configured or modified on a per-frame basis and double buffering may be used.

In another example, the Bayer-to-Bayer component may include a PZSFT component. In another example, the Bayer-to-Bayer component may include a half-RGB (½ RGB) component. In another example, the Bayer-to-Bayer component may include a color correction (CC) component, which may obtain subsampled data for local tone mapping, which may be used, for example, for applying an unsharp mask. In another example, the Bayer-to-Bayer component may include a Tone Control (TC) component, which may obtain subsampled data for local tone mapping, which may be used, for example, for applying an unsharp mask. In another example, the Bayer-to-Bayer component may include a Gamma (GM) component, which may apply a lookup-table independently per channel for color rendering (gamma curve application). Using a lookup-table, which may be an array, may reduce resource utilization, such as processor utilization, using an array indexing operation rather than more complex computation. The gamma component may obtain subsampled data for local tone mapping, which may be used, for example, for applying an unsharp mask.

In another example, the Bayer-to-Bayer component may include an RGB binning (RGB BIN) component, which may include a configurable binning factor, such as a binning factor configurable in the range from four to sixteen, such as four, eight, or sixteen. One or more sub-components of the Bayer-to-Bayer component, such as the RGB Binning component and the half-RGB component, may operate in parallel. The RGB binning component may output image data, such as to an external memory, which may include compressing the image data. The output of the RGB binning component may be a binned image, which may include low-resolution image data or low-resolution image map data. The output of the RGB binning component may be used to extract statistics for combing images, such as combining hemispherical images. The output of the RGB binning component may be used to estimate flare on one or more lenses, such as hemispherical lenses. The RGB binning component may obtain G channel values for the binned image by averaging Gr channel values and Gb channel values. The RGB binning component may obtain one or more portions of or values for the binned image by averaging pixel values in spatial areas identified based on the binning factor. In another example, the Bayer-to-Bayer component may include, such as for spherical image processing, an RGB-to-YUV component, which may obtain tone mapping statistics, such as histogram data and thumbnail data, using a weight map, which may weight respective regions of interest prior to statistics aggregation.

The image signal processor 620, or one or more components thereof, such as the local motion estimation components, which may generate local motion estimation data for use in image signal processing and encoding, such as in correcting distortion, stitching, and/or motion compensation. For example, the local motion estimation components may partition an image into blocks, arbitrarily shaped patches, individual pixels, or a combination thereof. The local motion estimation components may compare pixel values between frames, such as successive images, to determine displacement, or movement, between frames, which may be expressed as motion vectors (local motion vectors).

The image signal processor 620, or one or more components thereof, such as the local motion compensation components, which may obtain local motion data, such as local motion vectors, and may spatially apply the local motion data to an image to obtain a local motion compensated image or frame and may output the local motion compensated image or frame to one or more other components of the image signal processor 620.

The image signal processor 620, or one or more components thereof, such as the global motion compensation components, may receive, or otherwise access, global motion data, such as global motion data from a gyroscopic unit of the image capture apparatus, such as the gyroscope 546 shown in FIG. 5, corresponding to the current frame. The global motion compensation component may apply the global motion data to a current image to obtain a global motion compensated image, which the global motion compensation component may output, or otherwise make available, to one or more other components of the image signal processor 620

The image signal processor 620, or one or more components thereof, such as the Bayer-to-RGB components, which convert the image data from Bayer format to an RGB format. The Bayer-to-RGB components may implement white balancing and demosaicing. The Bayer-to-RGB components respectively output, or otherwise make available, RGB format image data to one or more other components of the image signal processor 620.

The image signal processor 620, or one or more components thereof, such as the image processing units, which perform warping, image registration, electronic image stabilization, motion detection, object detection, or the like. The image processing units respectively output, or otherwise make available, processed, or partially processed, image data to one or more other components of the image signal processor 620.

The image signal processor 620, or one or more components thereof, such as the high dynamic range components, may, respectively, generate high dynamic range images based on the current input image, the corresponding local motion compensated frame, the corresponding global motion compensated frame, or a combination thereof. The high dynamic range components respectively output, or otherwise make available, high dynamic range images to one or more other components of the image signal processor 620.

The high dynamic range components of the image signal processor 620 may, respectively, include one or more high dynamic range core components, one or more tone control (TC) components, or one or more high dynamic range core components and one or more tone control components. For example, the image signal processor 620 may include a high dynamic range component that includes a high dynamic range core component and a tone control component. The high dynamic range core component may obtain, or generate, combined image data, such as a high dynamic range image, by merging, fusing, or combining the image data, such as unsigned 14-bit RGB format image data, for multiple, such as two, images (HDR fusion) to obtain, and output, the high dynamic range image, such as in an unsigned 23-bit RGB format (full dynamic data). The high dynamic range core component may output the combined image data to the Tone Control component, or to other components of the image signal processor 620. The Tone Control component may compress the combined image data, such as from the unsigned 23-bit RGB format data to an unsigned 17-bit RGB format (enhanced dynamic data).

The image signal processor 620, or one or more components thereof, such as the three-dimensional noise reduction components reduce image noise for a frame based on one or more previously processed frames and output, or otherwise make available, noise reduced images to one or more other components of the image signal processor 620. In some implementations, the three-dimensional noise reduction component may be omitted or may be replaced by one or more lower-dimensional noise reduction components, such as by a spatial noise reduction component. The three-dimensional noise reduction components of the image signal processor 620 may, respectively, include one or more temporal noise reduction (TNR) components, one or more raw-to-raw (R2R) components, or one or more temporal noise reduction components and one or more raw-to-raw components. For example, the image signal processor 620 may include a three-dimensional noise reduction component that includes a temporal noise reduction component and a raw-to-raw component.

The image signal processor 620, or one or more components thereof, such as the sharpening components, obtains sharpened image data based on the image data, such as based on noise reduced image data, which may recover image detail, such as detail reduced by temporal denoising or warping. The sharpening components respectively output, or otherwise make available, sharpened image data to one or more other components of the image signal processor 620.

The image signal processor 620, or one or more components thereof, such as the raw-to-YUV components, may transform, or convert, image data, such as from the raw image format to another image format, such as the YUV format, which includes a combination of a luminance (Y) component and two chrominance (UV) components. The raw-to-YUV components may, respectively, demosaic, color process, or a both, images.

Although not expressly shown in FIG. 6, in some implementations, a respective raw-to-YUV component may include one or more sub-components. For example, the raw-to-YUV component may include a white balance (WB) component, which performs white balance correction on the image data. In another example, a respective raw-to-YUV component may include one or more color correction components (CC0, CC1), which may implement linear color rendering, which may include applying a 3×3 color matrix. For example, the raw-to-YUV component may include a first color correction component (CC0) and a second color correction component (CC1). In another example, a respective raw-to-YUV component may include a three-dimensional lookup table component, such as subsequent to a first color correction component. Although not expressly shown in FIG. 6, in some implementations, a respective raw-to-YUV component may include a Multi-Axis Color Correction (MCC) component, such as subsequent to a three-dimensional lookup table component, which may implement non-linear color rendering, such as in Hue, Saturation, Value (HSV) space.

In another example, a respective raw-to-YUV component may include a black point RGB removal (BPRGB) component, which may process image data, such as low intensity values, such as values within a defined intensity threshold, such as less than or equal to, 28, to obtain histogram data wherein values exceeding a defined intensity threshold may be omitted, or excluded, from the histogram data processing. In another example, a respective raw-to-YUV component may include a Multiple Tone Control (Multi-TC) component, which may convert image data, such as unsigned 17-bit RGB image data, to another format, such as unsigned 14-bit RGB image data. The Multiple Tone Control component may apply dynamic tone mapping to the Y channel (luminance) data, which may be based on, for example, image capture conditions, such as light conditions or scene conditions. The tone mapping may include local tone mapping, global tone mapping, or a combination thereof.

In another example, a respective raw-to-YUV component may include a Gamma (GM) component, which may convert image data, such as unsigned 14-bit RGB image data, to another format, such as unsigned 10-bit RGB image data. The Gamma component may apply a lookup-table independently per channel for color rendering (gamma curve application). Using a lookup-table, which may be an array, may reduce resource utilization, such as processor utilization, using an array indexing operation rather than more complex computation. In another example, a respective raw-to-YUV component may include a three-dimensional lookup table (3DLUT) component, which may include, or may be, a three-dimensional lookup table, which may map RGB input values to RGB output values through a non-linear function for non-linear color rendering. In another example, a respective raw-to-YUV component may include a Multi-Axis Color Correction (MCC) component, which may implement non-linear color rendering. For example, the multi-axis color correction component may perform color non-linear rendering, such as in Hue, Saturation, Value (HSV) space.

The image signal processor 620, or one or more components thereof, such as the Chroma Noise Reduction (CNR) components, may perform chroma denoising, luma denoising, or both.

The image signal processor 620, or one or more components thereof, such as the local tone mapping components, may perform multi-scale local tone mapping using a single pass approach or a multi-pass approach on a frame at different scales. The as the local tone mapping components may, respectively, enhance detail and may omit introducing artifacts. For example, the Local Tone Mapping components may, respectively, apply tone mapping, which may be similar to applying an unsharp-mask. Processing an image by the local tone mapping components may include obtaining, processing, such as in response to gamma correction, tone control, or both, and using a low-resolution map for local tone mapping.

The image signal processor 620, or one or more components thereof, such as the YUV-to-YUV (Y2Y) components, may perform local tone mapping of YUV images. In some implementations, the YUV-to-YUV components may include multi-scale local tone mapping using a single pass approach or a multi-pass approach on a frame at different scales.

The image signal processor 620, or one or more components thereof, such as the warp and blend components, may warp images, blend images, or both. In some implementations, the warp and blend components may warp a corona around the equator of a respective frame to a rectangle. For example, the warp and blend components may warp a corona around the equator of a respective frame to a rectangle based on the corresponding low-resolution frame. The warp and blend components, may, respectively, apply one or more transformations to the frames, such as to correct for distortions at image edges, which may be subject to a close to identity constraint.

The image signal processor 620, or one or more components thereof, such as the stitching cost components, may generate a stitching cost map, which may be represented as a rectangle having disparity (x) and longitude (y) based on a warping. Respective values of the stitching cost map may be a cost function of a disparity (x) value for a corresponding longitude. Stitching cost maps may be generated for various scales, longitudes, and disparities.

The image signal processor 620, or one or more components thereof, such as the scaler components, may scale images, such as in patches, or blocks, of pixels, such as 16×16 blocks, 8×8 blocks, or patches or blocks of any other size or combination of sizes.

The image signal processor 620, or one or more components thereof, such as the configuration controller, may control the operation of the image signal processor 620, or the components thereof.

The image signal processor 620 outputs processed image data, such as by storing the processed image data in a memory of the image capture apparatus, such as external to the image signal processor 620, or by sending, or otherwise making available, the processed image data to another component of the image processing pipeline 600, such as the encoder 630, or to another component of the image capture apparatus.

The encoder 630 encodes or compresses the output of the image signal processor 620. In some implementations, the encoder 630 implements one or more encoding standards, which may include motion estimation. The encoder 630 outputs the encoded processed image to an output 670. In an embodiment that does not include the encoder 630, the image signal processor 620 outputs the processed image to the output 670. The output 670 may include, for example, a display, such as a display of the image capture apparatus, such as one or more of the displays 108, 142 shown in FIGS. 1A-1B, the display 224 shown in FIG. 2B, the display 424 shown in FIG. 4A, or the display 566 shown in FIG. 5, to a storage device, or both. The output 670 is a signal, such as to an external device.

Figure 7A:
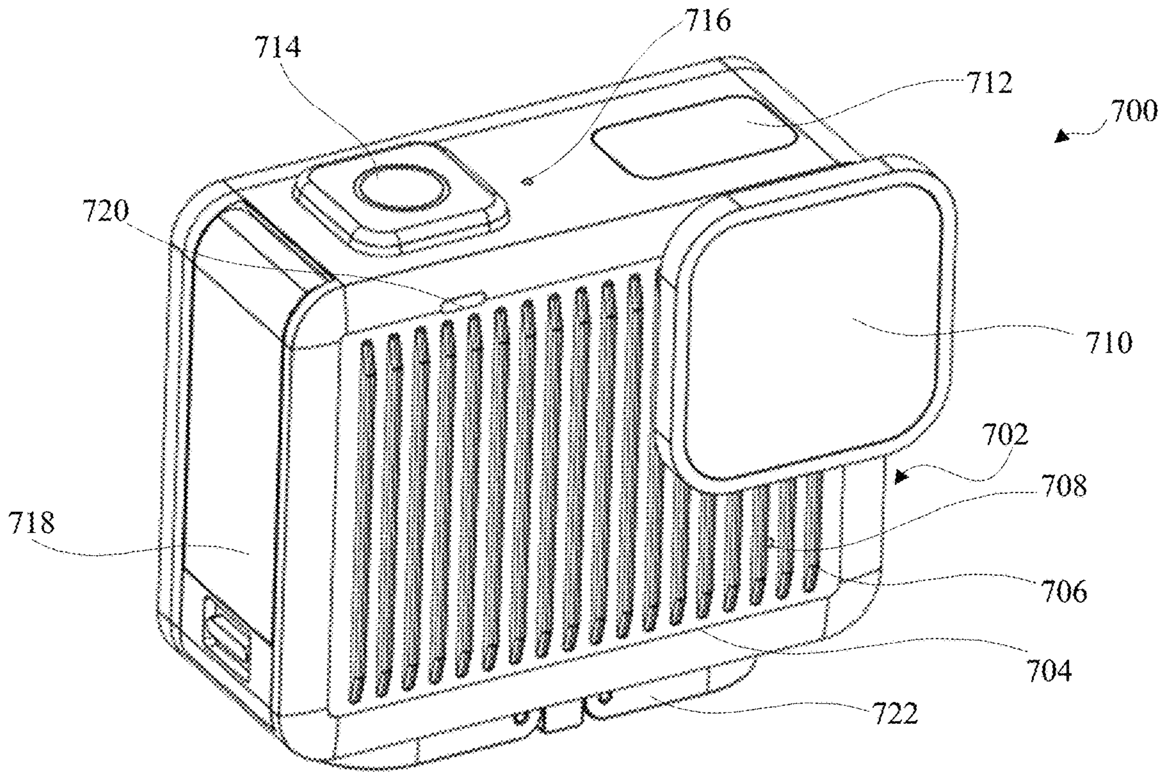
FIGS. 7A-7B are isometric views of another example of an image capture apparatus.

FIG. 7A is a front isometric view of an image capture apparatus 700. The image capture apparatus 700 has a front housing 702. The front housing 702 includes or is a forward heatsink 704. The forward heatsink 704 removes heat from the image capture apparatus 700. The forward heatsink 704 removes heat as air travels across the forward heatsink 704.

The forward heatsink 704 may be made of a conductive material. The forward heatsink 704 may be made of aluminum, stainless steel, titanium, or any other conductive metal. The forward heatsink 704 may include fins 706.

The fins 706 may be a raised surface on the forward heatsink 704. The fins 706 may create turbulence, increase surface area, or both. The fins 706 may add rigidity to the forward heatsink 704. The fins 706 may cover most of the front housing 702 (e.g., about 70% or more, about 80% or more, about 90% or more of a surface area of the forward heatsink 704). A front microphone 708 may be located between two of the fins 706.

The front microphone 708 may capture sound generally in a forward direction. The front microphone 708 may be located adjacent to a lens 710. The front microphone 708 may be located directly below the lens 710.

The lens 710 may be a sealed lens, free of fluid exchange, include a radial seal, or a combination thereof. The lens 710 may be an outer lens that covers an integrated sensor and lens assembly (ISLA). The lens 710 may be connected via a bayonet. The lens 710 may capture images. The lens 710 may be located adjacent to a display 712.

The display 712 may be located on a top of the image capture apparatus 700. The display 712 may be generally rectangular, ovoid, or have another shape. The display 712 may be located between edges of the forward side and the rear side. The display 712 may show an image before the image is captured (e.g., a preview image), the display 712 may show an image after the image is captured, the display 712 may show operating functions of the image capture apparatus 700, or a combination thereof. The display 712 may be located adjacent a shutter button 714.

The shutter button 714, when actuated, may capture images. The shutter button 714 may be sealed to avoid liquid ingress (or egress). The shutter button 714 may be sealed to a depth underwater of about 10 m or more or about 20 m or less. A top microphone 716 may be located between the display 712 and the shutter button 714.

The top microphone 716 may be located on a different wall than the front microphone 708. The top microphone 716 and the front microphone 708 may be identical. The top microphone 716 and the front microphone 708 may be selected based on which microphone captures audio with a least amount of background noise. A door 718 may be located adjacent to the shutter button 714 and the display 712.

The door 718 may open to allow access to charge, switch memory cards, remove batteries, plug in a cord, or a combination thereof. The door 718 may be sealed when the door is closed. The door 718 may include a latch. The door 718 may be substantially a same size as a side of the image capture apparatus 700. The door 718 may be located on a side of the image capture apparatus 700 and an indicator 720 may be located on a front of the image capture apparatus 700.

The indicator 720 may be a light. The indicator 720 may indicate that the power is on. The indicator 720 may indicate that an image is being captured, a timer is set and about to capture an image, or both. The image capture apparatus 700 may include an interconnect mechanism 722 at a bottom opposite the display 712.

The interconnect mechanism 722 may be openable and closeable. The interconnect mechanism 722 may connect to a connect to a holder, a tri-pod, a selfie stick, a helmet, a harness, a device used in a sport, or a combination thereof. The interconnect mechanism 722 may be removable.

Figure 7B:
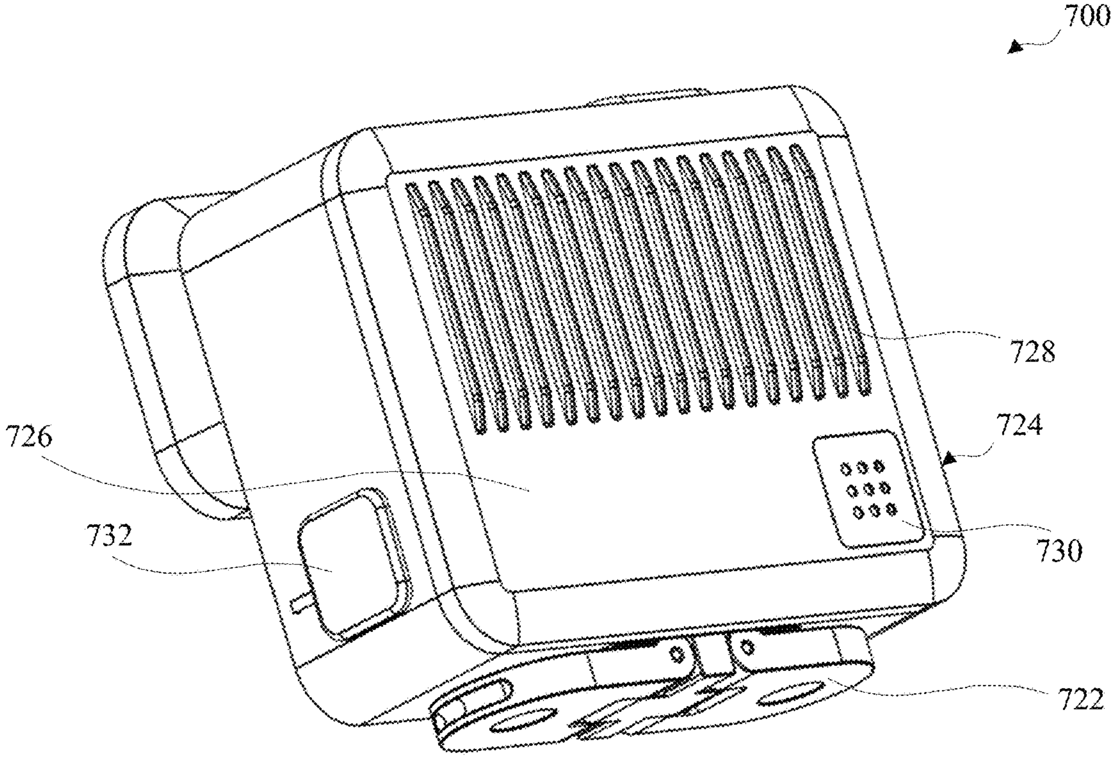

FIG. 7B is a rear isometric view of the image capture apparatus 700 of FIG. 7A. The image capture apparatus 700 includes a rear housing 724 that includes or is a rear heatsink 726. The rear heatsink 726 may be made of the same material and have the same features as the forward heatsink 704 of FIG. 7A. The rear heatsink 726 may be made of a conductive material. The rear heatsink 726 may be made of aluminum. The rear heatsink 726 may include multiple rear fins 728. The rear heatsink 726 may cover most of the rear housing 724. The rear housing 724 may be the rear heatsink 726.

The rear fins 728 may assist in removing thermal energy from the image capture apparatus 700. The rear fins 728 may create a grip on the surface of the rear housing 724. The rear fins 728 may be raised or recessed. The rear fins 728 may be located adjacent to a speaker 730.

The speaker 730 functions to provide audible feedback or to playback sound captured by the image capture apparatus 700. The speaker 730 may play beeps, spoken words, ambient sound, animal sounds, or a combination thereof. The speaker 730 may make a sound when a button 732 is actuated.

The button 732 may be a power button, a control button, a mode button, or a combination thereof. The button 732, when actuated, may turn on the display, scroll between windows in the display, change operations of the image capture apparatus, 700, or a combination thereof. The button 732 may be located on a side of the image capture apparatus 700, adjacent the rear housing 724, or both.

Figure 7C:
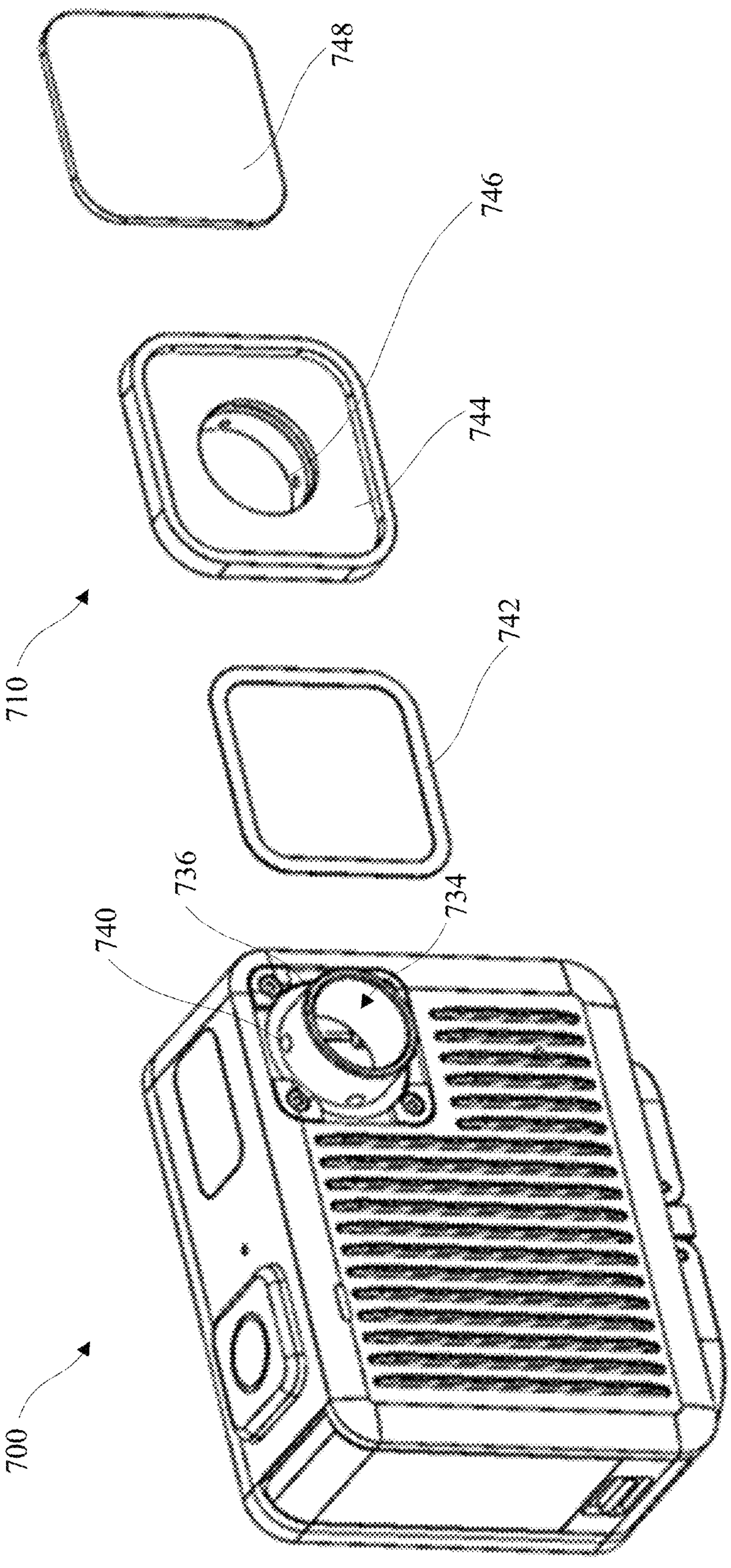
FIG. 7C is a partially exploded view of the image capture apparatus of FIGS. 7A-7B.

FIG. 7C is a partially exploded view of the lens 710 of the image capture apparatus 700 of FIGS. 7A-7B. The lens 710, when removed, exposes an integrated sensor and lens assembly (ISLA) 734. The ISLA 734 is a series of lenses that are optically aligned with an image sensor (not shown). The ISLA 734 gathers light and captures images. The ISLA 734 extends through a connection mechanism 736.

The connection mechanism 736 removably connects the lens 710 to the image capture apparatus 700. The connection mechanism 736 may be a bayonet. The connection mechanism 736 may include threads, detents, twist locks, or a combination thereof. The connection mechanism 736 may include detent projections 740.

The detent projections 740 may extend outward from the connection mechanism 736. The detent projections 740 may be bumps, domes, circular, or a combination thereof. The detent projections 740 may assist in creating a connection with the lens 710. The detent projections 740 may create a friction fit with the lens 710 so that the lens 710 is retained on the image capture apparatus 700 once a connection is formed. When a fixed connection is formed between the lens 710 and the image capture apparatus 700, a seal 742 disposed between the image capture apparatus 700 and the lens 710 may be compressed.

The seal 742 may be compressed by a radial force, an axial force, or both. The seal 742 may be made of or include rubber, an elastomer, a polymer, plastic, or a combination thereof. The seal 742 may be sandwiched between an image capture apparatus 700 and a lens cover 744.

The lens cover 744 may attach to the connection mechanism 736 to cover the ISLA 734. The lens cover 744 may form a forward end of the ISLA 734. The lens cover 744 may include detent recesses 746 that receive the detent projections 740 of the connection mechanism 736 to form a connection. The detent recesses 746 may mirror a shape of the detent projections 740. For example, if the detent projections 740 are round then the detent recesses 746 will be round. The detent recesses 746 may retain the detent projections 740 so that the lens cover 744 is prevented from moving. The detent projections 740 may create a friction fit with the detent recesses 746. An element 748 may be connected to the lens cover 744.

The element 748 may protect the ISLA 734. The element 748 (e.g., lens element) may seal the lens cover 744. The element 748 may be made of glass, plastic, a polymer, a polycarbonate, acrylic, or a combination thereof.

Figure 8:
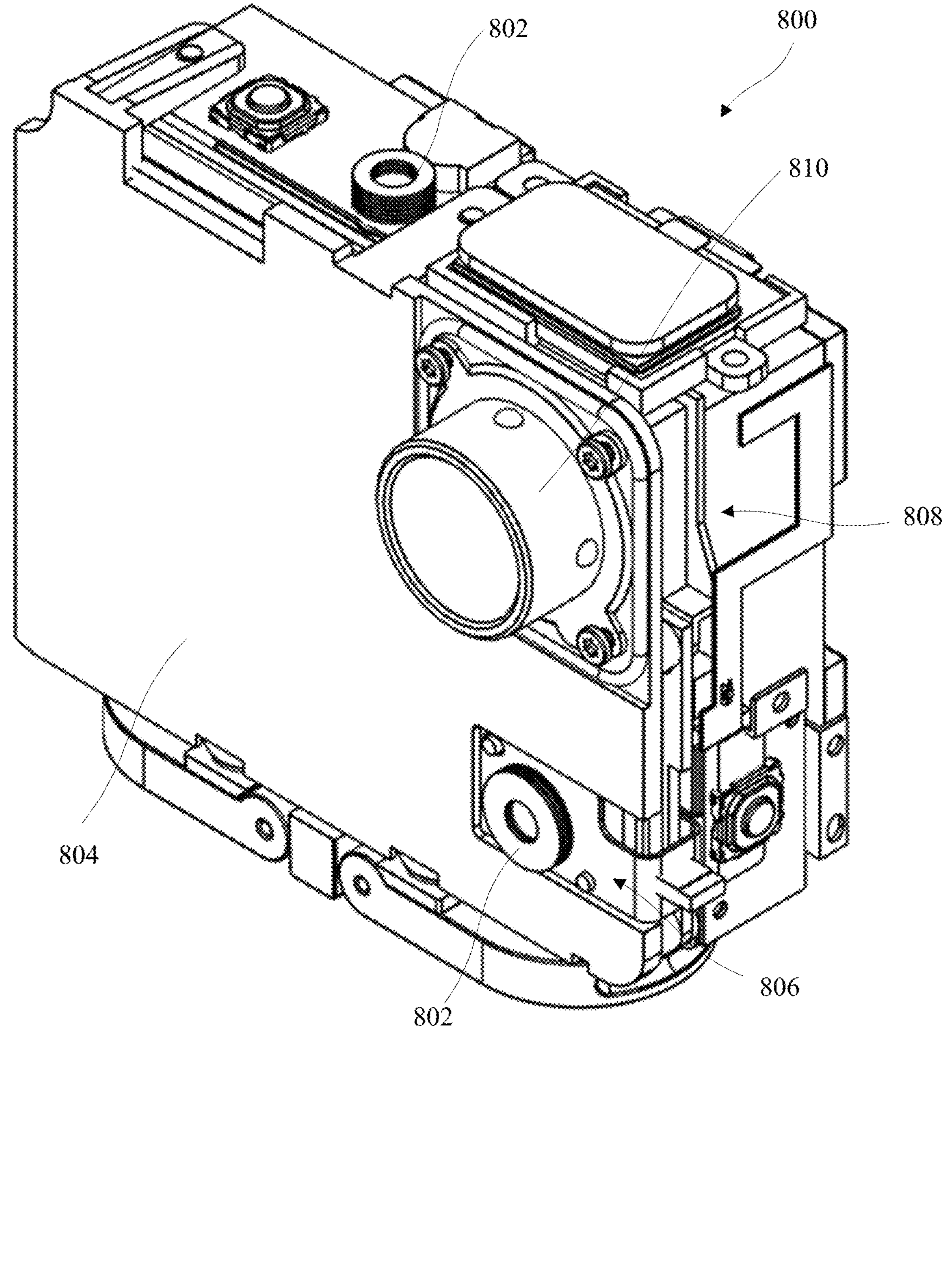
FIG. 8 is a front isometric view of the image capture apparatus of FIG. 7A with the housing removed.

FIG. 8 is an isometric view of an image capture apparatus 800 of FIGS. 7A-7C with the forward housing 702 and the rear housing 724 removed. With the housings 702 and 724 removed, the microphone seals 802 and front heatsink 804 are exposed.

The microphone seals 802 are located on adjacent surfaces. The microphone seals 802 may be located on any surface that includes a microphone (located below the microphone seal 802). The microphone seals 802 may be located on the front, top, a side, rear, or a combination thereof of the image capture apparatus 800. The microphone seals 802 may prevent fluids from directly contacting the microphone. The microphone seals 802 may allow sound to come into communication with the microphone and prevent fluids such as water from contacting the microphone. The microphone seals 802 may extend through the front heatsink 804 or the front heatsink 804 may include a microphone recess 806 that accommodates the microphone seals 802.

The microphone recess 806 may be an absence of material in the front heatsink 804. The microphone recess 806 may be an area of the front heatsink 804 where the microphone seal 802 extends therethrough. The microphone recess 806 may mirror a shape of the microphone seal 802. The microphone recess 806 may have a shape that is geometric, non-geometric, square, oval, rectangular, circular, triangular, or a combination thereof. The microphone recess 806 may extend along one or more sides, two or more sides, three or more sides, or four or more sides of the microphone seal 802. The microphone recesses 806 may surround the microphone seals 802. The front heatsink 804 may have an upper surface that is substantially coplanar with a top surface of the microphone seal 802 located within the microphone recess 806. The microphone recess 806 may be located adjacent to an ISLA recess 808 in the front heatsink 804.

The ISLA recess 808 may be an absence of material that the ISLA (not shown) extends through, the connection mechanism 810, or both. The ISLA recess 808 and the ISLA, the connection mechanism 810, or both may be mirrored in shape. The ISLA recess 808 may be geometric, non-geometric, square, rectangular, oval, round, triangular, diamond, or a combination thereof. The ISLA recess 808 may permit the ISLA, the connection mechanism 810, or both to extend therethrough.

Figure 9:
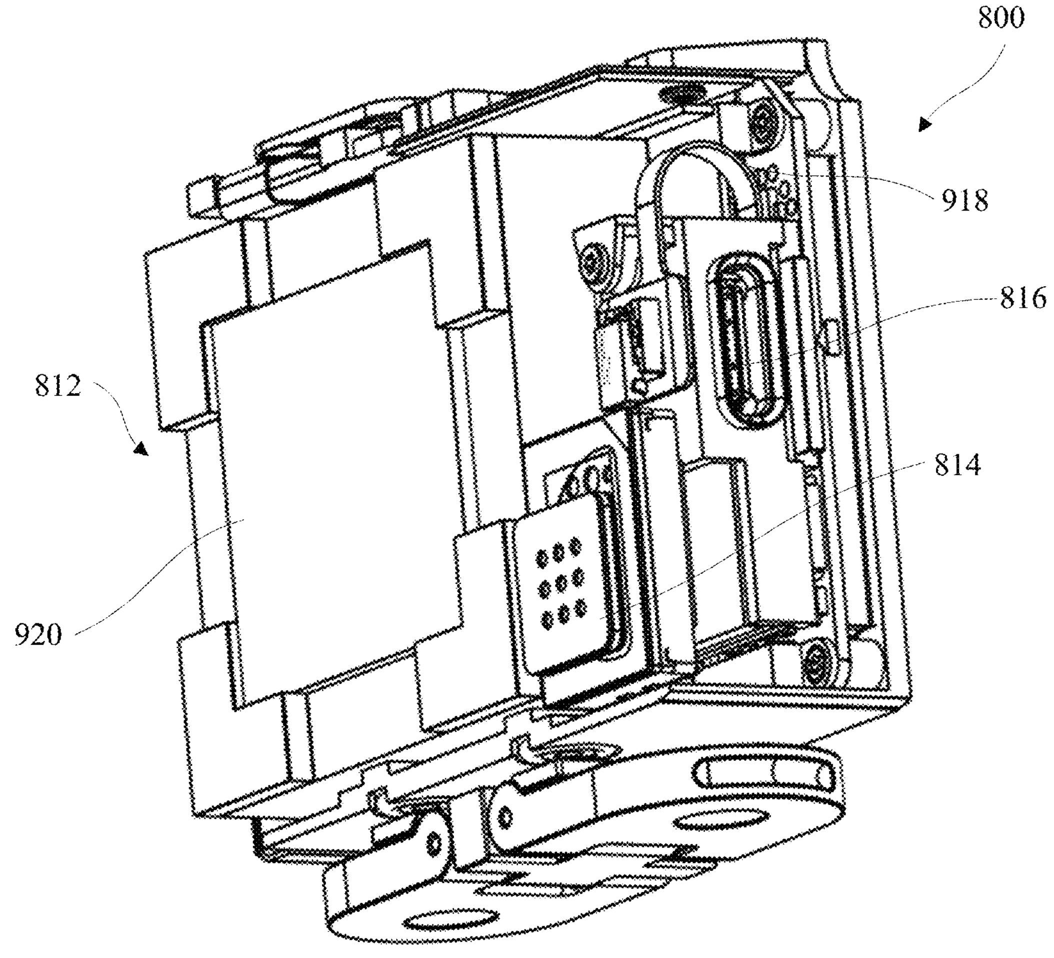
FIG. 9 is a rear isometric view of the image capture apparatus of FIG. 8.

FIG. 9 is an isometric rear view of the image capture apparatus 800 of FIG. 8. The image capture apparatus 800 includes a battery 812. The battery 812 functions to power the image capture apparatus 800. The battery 812 may be rechargeable. The battery 812 may be lithium ion, alkaline, nickel metal, zinc, magnesium, lead acid, or a combination thereof. The battery 812 may power a speaker 814.

The speaker 814 functions to produce sounds, reproduce sounds during video capture, or both. The speaker 814 may be located adjacent to a port 816.

The port 816 may function to charge the battery 812, exchange data, access memory, or a combination thereof. The port 816 may be a USB port, USB-C port, a micro-USB, power plug, or a combination thereof. The port 816 may be in communication with memory, a CPU, a microprocessor, or a combination thereof. The port 816 may connect to a flexible connector 918. The flexible connector 918 may energy, communication, or both throughout the image capture apparatus 800.

The battery 812 may be connected with a battery thermal interface material (TIM) 920. The battery TIM 920 may directly connect the battery 812 to the rear heatsink 726. The battery TIM 920 may assist in bridging any gaps between the battery 812 and the rear heatsink 726.

Figure 10A:
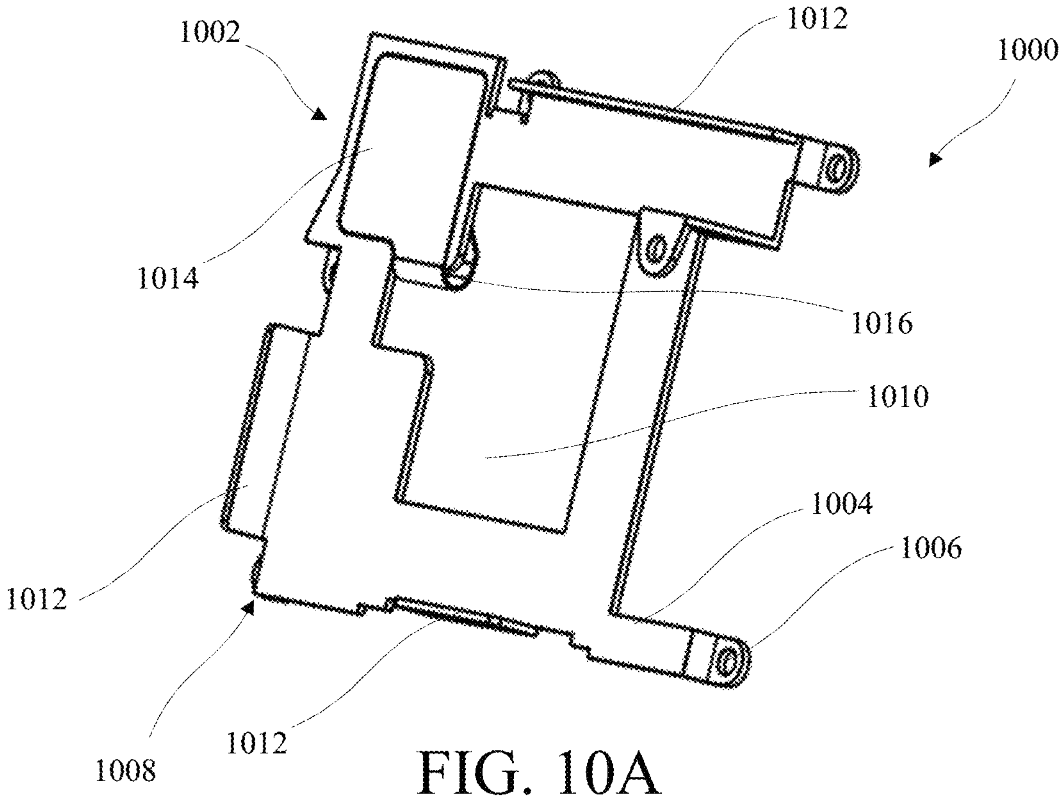
FIG. 10A is a rear isometric view of a battery bracket with a battery heat spreader.

FIG. 10A is a rear isometric view of a battery bracket 1000 connected to a battery heat spreader 1002. The battery bracket 1000 functions to connect a battery (e.g., 812 of FIG. 9) into an image capture apparatus such as the image capture apparatus of FIGS. 1A-4B and 7A-9. The battery bracket 1000 may secure a battery inside of the image capture apparatus. The battery bracket 1000 may remove thermal energy or assist in providing thermal energy to a battery. The battery bracket 1000 may be rigid. The battery bracket 1000 may be made of metal, a conductive material, a polymer, a fibrous material, or a combination thereof. The battery bracket 1000 may act has a heatsink, connect the battery to a heatsink, connect the battery to a sourced of thermal energy, or a combination thereof. The battery bracket 1000 may shield RF signals. The battery bracket 1000 may be in communication with a battery heat spreader 1002 that removes thermal energy from the battery, the battery bracket 1002, or both and moves the thermal energy to another location. The battery heat spreader 1002 may transfer thermal energy to the battery.

The battery heat spreader 1002 may move thermal energy from a first location into the battery bracket 1000, the battery, or both. The battery heat spreader 1002 may extend from a first side of the battery bracket 1000 to a second side of the battery bracket 1000. The battery heat spreader 1002 may connect to an image sensor (not shown) and then transfer the thermal energy to a location between the battery (not shown) and the battery bracket 1000. The battery bracket 1000 may be made of a thermally conductive material, a metal, aluminum, a material that includes metal, or a combination thereof. The battery bracket 1000 includes one or more arms 1004 with one or more bosses 1006.

The one or more arms 1004 may extend outward from a body 1008. The one or more arms 1004 may extend around other components of the image capture device. The one or more arms 1004 may increase surface area, spread out the battery bracket 1000, reduce weight of the battery bracket 1000 while housing the battery, or a combination thereof. The arms 1004 may extend cantilever from the body 1008. The one or more arms 1004 may extend beyond an area of the battery so that the battery and the battery bracket 1000 are connected within the image capture apparatus. The arms 1004 may be coplanar with the body 1008. Some of the arms 1004 may include the bosses 1006 that connect internally within the image capture apparatus and some of the bosses 1006 may connect to the battery.

The bosses 1006 function to receive a fastener (e.g., a screw) that connect the battery bracket 1000 to a battery or within the image capture apparatus. The bosses 1006 may be an aperture or a through hole in the battery bracket 1000. The bosses 1006 may be round, threaded, free of threads, or a combination thereof. The bosses 1006 may be located in the arms 1004, the body 1008, or both.

The body 1008 function to be in contact with a battery. The body 1008 functions to support the battery or connect the battery withing the image capture apparatus. The body 1008 may have a size that is substantially identical to the battery. The body 1008 may contact the battery when the battery is installed within the image capture apparatus. The body 1008 may include one or more openings 1010 and one or more shoulders 1012.

The one or more openings 1010 may be an absence of material in the battery bracket 1000. The one or more openings 1010 may be a through hole, removed material, or both. The one or more openings 1010 may have a shape. The shape may be geometric, non-geometric, irregular, square, rectangular, a combination of shapes, or a combination thereof. The one or more openings 1010 may permit components to extend through the battery bracket 1000.

The shoulders 1012 may function to guide a battery into the image capture apparatus. The shoulders 1012 may stop the battery at a desired location. The shoulders 1012 may extend outward from the body 1008. The shoulders 1012 may extend at substantially a right angle with the body 1008. The shoulders 1012 may be bent relative to the body 1008. The shoulders 1012 may be located on three sides of the battery bracket 1000. One side of the battery bracket 1000 may be free of a shoulder 1012 so that the battery may move in and out relative to the battery bracket 1000. When the battery is moved into the battery bracket 1000 and into contact with a shoulder 1012 the battery may be in contact with the battery heat spreader 1002 via a battery pad 1014.

The battery pad 1014 functions to move thermal energy into the battery, the battery heat spreader 1002, out of the battery, out of the battery heat spreader 1002, or a combination thereof. The battery pad 1014 may be connected to the battery bracket 1000, the battery, or both. The battery pad 1014 may be physically connected (e.g., by an adhesive) and in communication with the battery. The battery pad 1014 may move thermal energy to the battery, the battery bracket 1000, or both. The battery pad 1014 may remove thermal energy from the battery, the battery bracket 1000, or both. The battery pad 1014 may include a TIM (e.g., 908 of FIG. 9). The battery pad 1014 may be connected to the battery bracket 1000 by the TIM and then a battery connector 1016 extends from the battery pad 1014 around the battery bracket 1000 through the opening 1010.

The battery connector 1016 may extend the battery heat spreader 1002 around components of the image capture apparatus. The battery connector 1016 may transfer thermal energy from a first end of the battery heat spreader 1002 to a second end of the battery heat spreader 1002. For example, an image sensor pad 1018 may be connected to the ISLA and the battery pad 1014 may be connected to the battery bracket 1000 by the battery connector 1016 extending to the battery bracket 1000. The battery connector 1016 may curve, bend, loop, twist, or a combination thereof so that thermal energy may be transferred between the battery pad 1014 and the image sensor pad 1018.

Figure 10B:
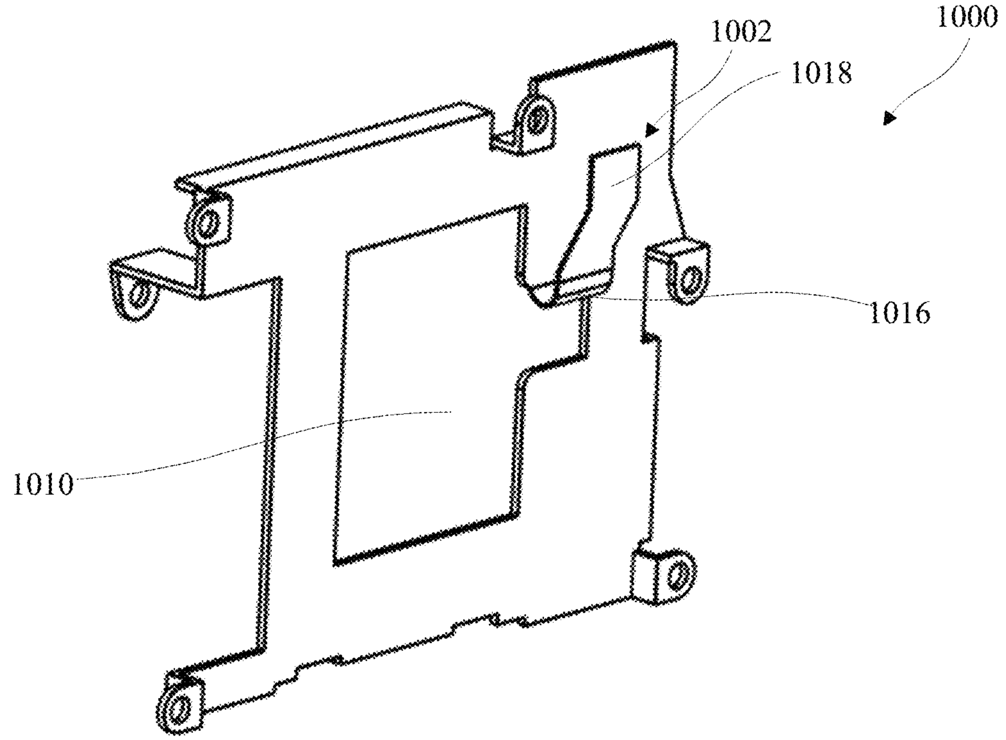
FIG. 10B is a front isometric view of the battery bracket and the battery heat spreader of FIG. 10A.

FIG. 10B is a front isometric view of the battery bracket 1000. As shown the battery heat spreader 1002 wraps around the battery bracket 1000 through the openings 1010. The battery connector 1016 of the battery heat spreader 1002 wraps and terminates at an image sensor pad 1018. The battery connector 1016 routes the battery heat spreader from an ISLA to the battery and the battery bracket 1000. The image sensor pad 1018 may connect directly to the image sensors of the ISLA. The image sensor pad 1018 may include a TIM. The image sensor pad 1018 may be adhesively connected to the image sensor of the ISLA. The image sensor pad 1018 may remove thermal energy from the image sensor. The image sensor pad 1018 may not put any stress on the ISLA such that the image sensor pad 1018 does not physically affect optical alignment of the ISLA.

Figure 10C:
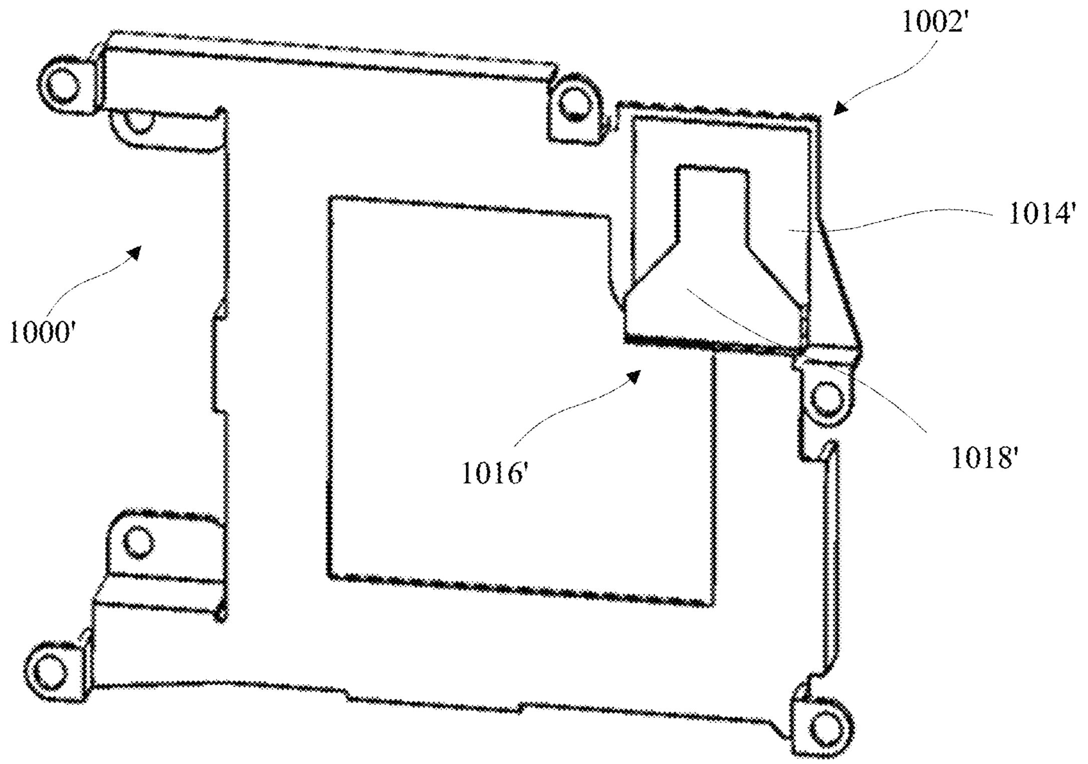
FIG. 10C is a front isometric view of a battery bracket and a battery heat spreader.

FIG. 10C is an isometric view of a battery bracket 1000' with a battery heat spreader 1002' located entirely on one side of the battery bracket 1000'. The battery heat spreader 1002' includes a battery pad 1014' that is configured to face a battery. A battery connector 1016' connects the battery pad 1014' to an image sensor pad 1018' that is configured to move thermal energy from an image sensor to a battery.

Figure 10D:
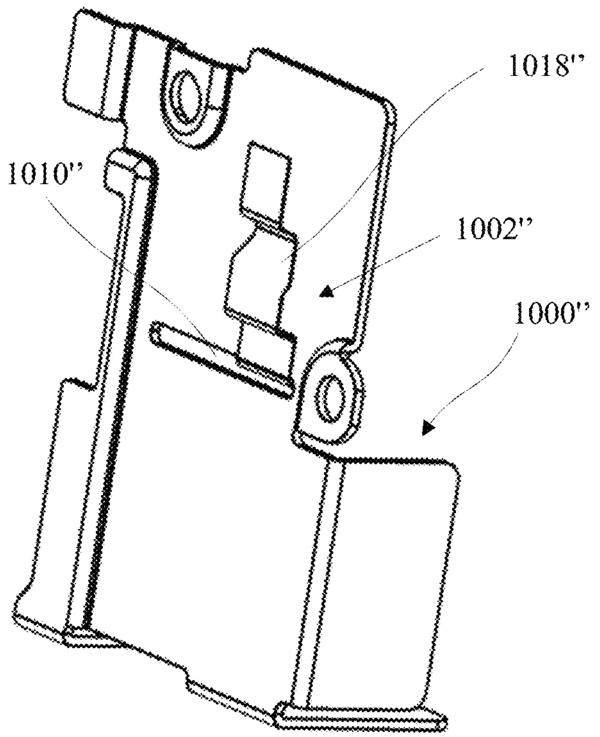
FIG. 10D is a front isometric view of a battery bracket and a battery heat spreader.

FIG. 10D is a front isometric view of a battery bracket 1000" and a battery heat spreader 1002". An image sensor pad 1018" extends through an opening 1010" in the battery bracket 1000" so that a battery heat spreader 1002" is located adjacent to opposing surfaces of the battery bracket 1000". The image sensor pad 1018" extends away from the battery bracket 1000" so that the image sensor pad 1018" can connect to or with an image sensor.

Figure 10E:
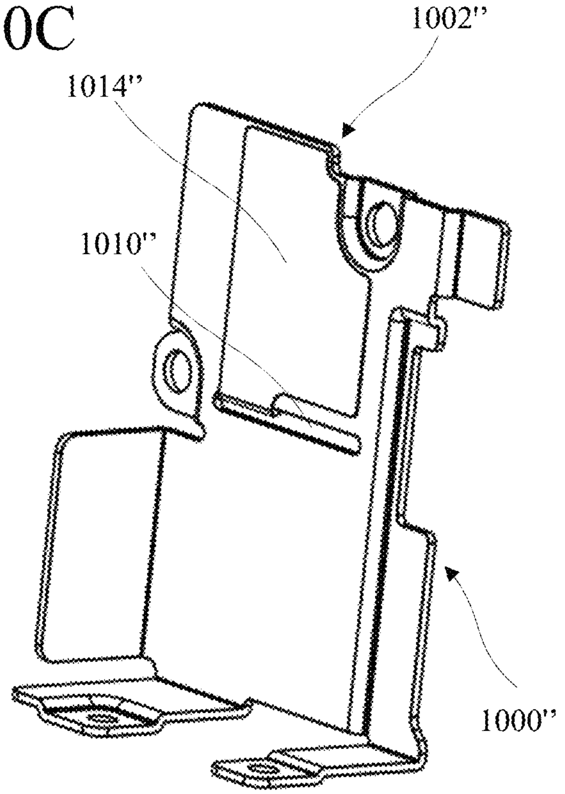
FIG. 10E is rear isometric view of the battery bracket and the battery heat spreader of FIG. 10D.

FIG. 10E is a rear isometric view of the battery bracket 1000" and the battery heat spreader 1002" of FIG. 10D. The battery heat spreader 1002" is directly connected to the battery bracket 1000" so that thermal energy from an image sensor is directed through the opening 1010" in the battery bracket 1002" to the battery pad 1014" to be dissipated in a battery (not shown).

Figure 10F:
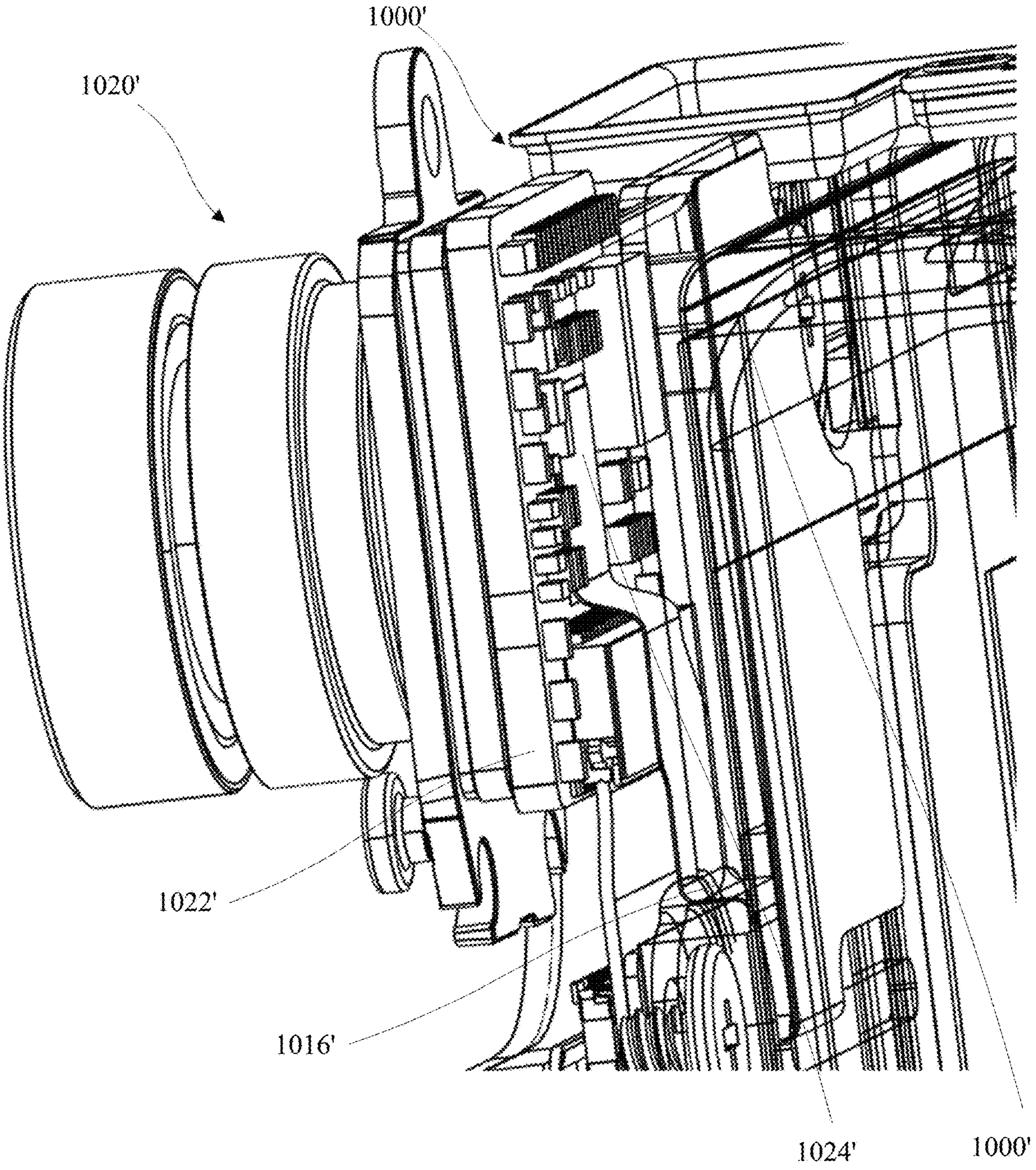
FIG. 10F is the battery bracket and the battery heat spreader of FIG. 10C located within the image capture apparatus of FIGS. 7A-7C.

FIG. 10F is an isometric view of the battery bracket 1000' and battery heat spreader 1002' of FIG. 10C incorporated into an image capture apparatus 1020'. The battery bracket 1000' and the battery heat spreader 1002' are located between and in contact with an image sensor 1022' and a battery 1024'. The battery bracket 1000' connects within the image capture apparatus 1020'. The battery bracket 1000' is retained adjacent to the battery 1024' so that the battery heat spreader 1002' and the battery 1024' are in direct contact. The battery bracket 1000' may directly connect to the battery 1024'. The battery bracket 1000' may connect within the image capture apparatus 1020' without directing connecting to the battery 1024'. The battery bracket 1000' may be made of any thermally conductive material. The battery bracket 1000' may be made of or include aluminum, titanium, or both. The battery bracket 1000' may support the battery heat spreader 1002' within the image capture apparatus 1020'.

The battery heat spreader 1002' connects at a first end to the image sensor 1022' or some other heat generating device. The battery heat spreader 1002' connect to the battery bracket 1000', the battery 1024', or both at a second end. The battery heat spreader 1002' may be sandwiched between the battery 1024' and the battery bracket 1000'. The battery heat spreader 1002' may be indirectly connected to the battery 1024' through the battery heat spreader 1002'. The battery heat spreader 1002' may be made of or include graphite, carbon, graphene, metal, a conductive material, or a combination hereof. The battery heat spreader 1002' is configured to move heat from a front of the image capture apparatus 1020' to a middle or a rear of the image capture apparatus 1020'. The battery heat spreader 1002' may balance heat within the image capture apparatus 1020'. The battery heat spreader 1002' may move thermal energy from an area with a high concentration of thermal energy to an area with a low concentration of thermal energy or to a heatsink or some other device that stores thermal energy.

Figure 11A:
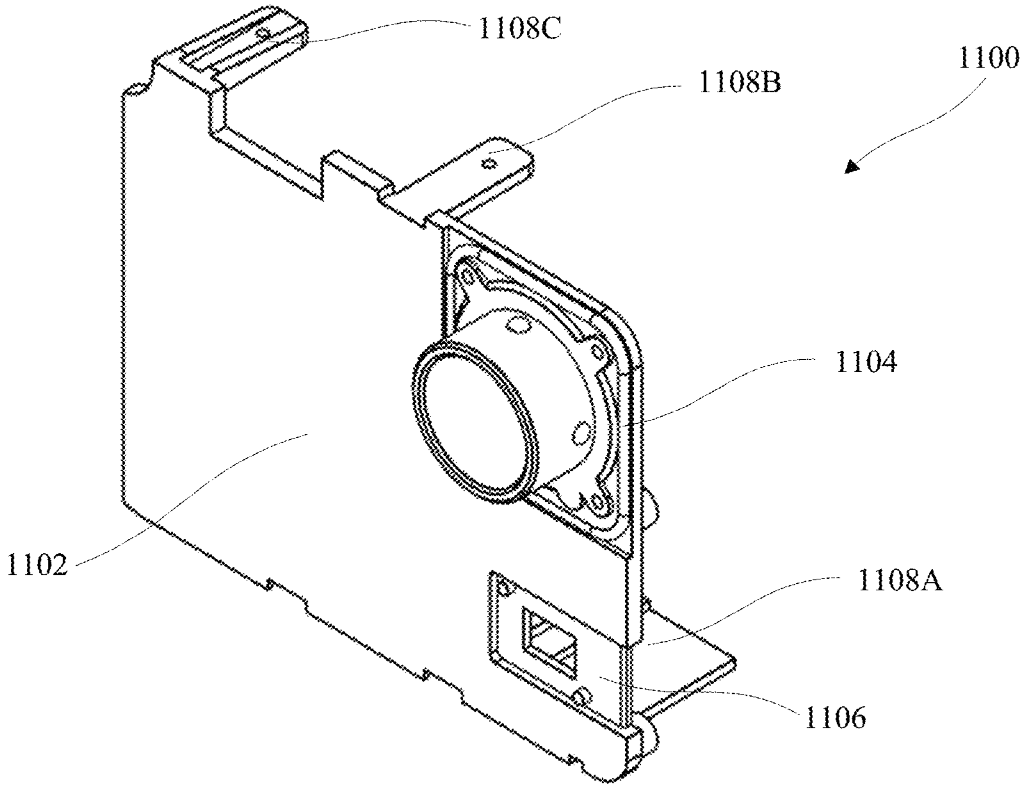
FIG. 11A is a front isometric view of a heatsink.

FIG. 11A is a front isometric view of a front heatsink 1100. The front heatsink 1100 includes a planar surface 1102. The planar surface 1102 is planar and flat. The planar surface 1102 is free of any holes or recesses. The planar surface 1102 is located adjacent to an ISLA recess 1104 and a microphone recess 1106.

The ISLA recess 1104 extends outward relative to the planar surface 1102. The ISLA recess 1104 form part of a connector that assists in connecting a lens to the image capture apparatus. The ISLA recess 1104 may protect the ISLA (not shown) while removing heat from the ISLA. The ISLA may have one or more lenses that extend all of the way through or partially through the ILSA recess 1104. The ISLA recess 1104 may be located adjacent to the microphone recess 1106.

The microphone recess 1106 may include a through hole so that all or a portion of the microphone extends through the through hole. The microphone recess 1106 may be a reduction of material so that the microphone may be counter sunk. The microphone recess 1106 may permit fluid to flow through the front heatsink 1100. A printed circuit board supporting the microphone may be located in a counter sunk portion or the through hole of the microphone recess 1106.

The front heatsink 1100 may include one or more mounting flanges 1108. The front heatsink 1100 as shown includes three mounting flanges 1108A, 1108B, and 1108C. The mounting flange 1108A may connect to the battery, support the battery, or both. The mounting flanges 1108B and 1108C may connect to and support a printed circuit board.

Figure 11B:
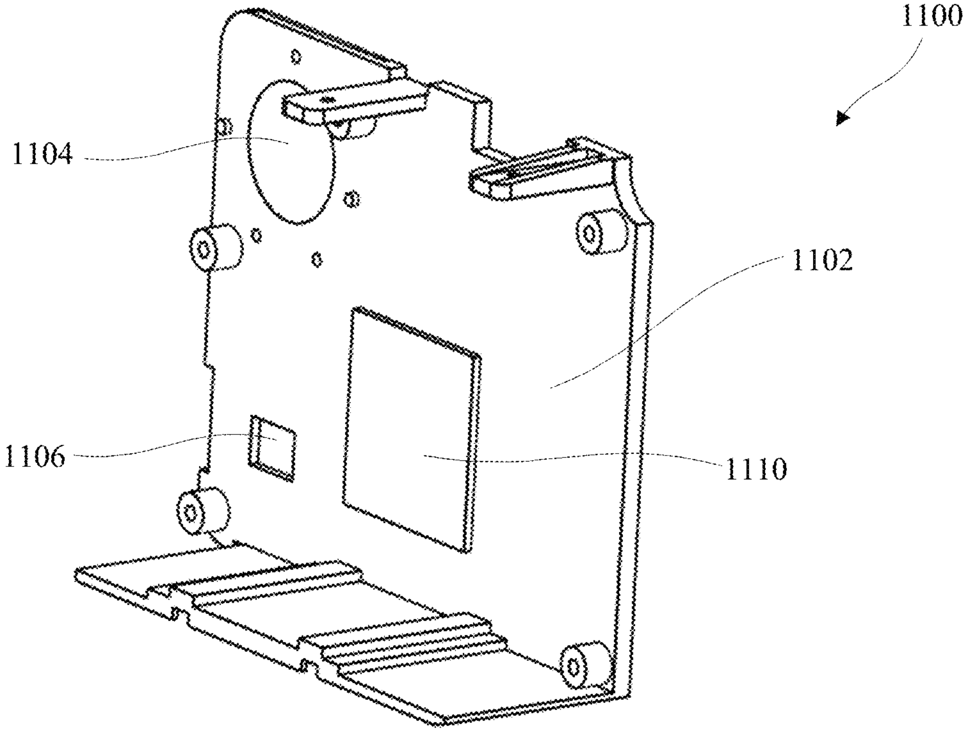
FIG. 11B is a rear isometric view of the heatsink of FIG. 11A.

FIG. 11B is a rear isometric view of the front heatsink 1100. As shown, the ISLA recess 1104 is shown where the ISLA may connect to the front heatsink 1100. The rear side of the microphone recess 1106 is shown. The microphone recess 1106 is shown including a rectangular through hole. The rear surface of the front heatsink 1100 faces a printed circuit board (not shown). The planar surface 1102 includes a component contact 1110 that contacts one or more components on the printed circuit board. The component contact 1110 may stick outward from the front heatsink 1100 and contact the one or more components. The component contact 1110 may be substantially a same size as the component the component contact 1110 is in thermal contact. The component contact 1110 may be longer than the component. The component contact 1110 may be in contact with a processor, a microprocessor, a CPU, an image processor, or a combination thereof. The component contact 1110 may extend outward a sufficient distance so that a thermal connection is created.

Figure 11C:
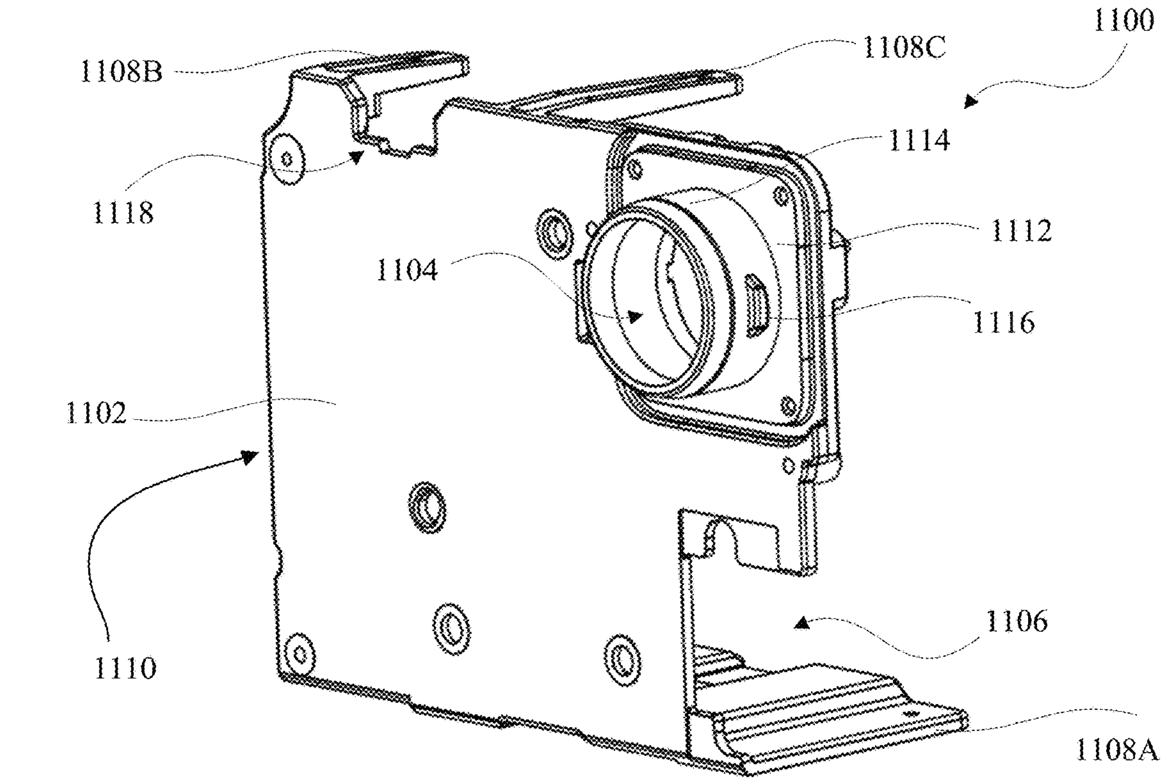
FIG. 11C is a front isometric view of a heatsink from a first side.
Figure 11D:
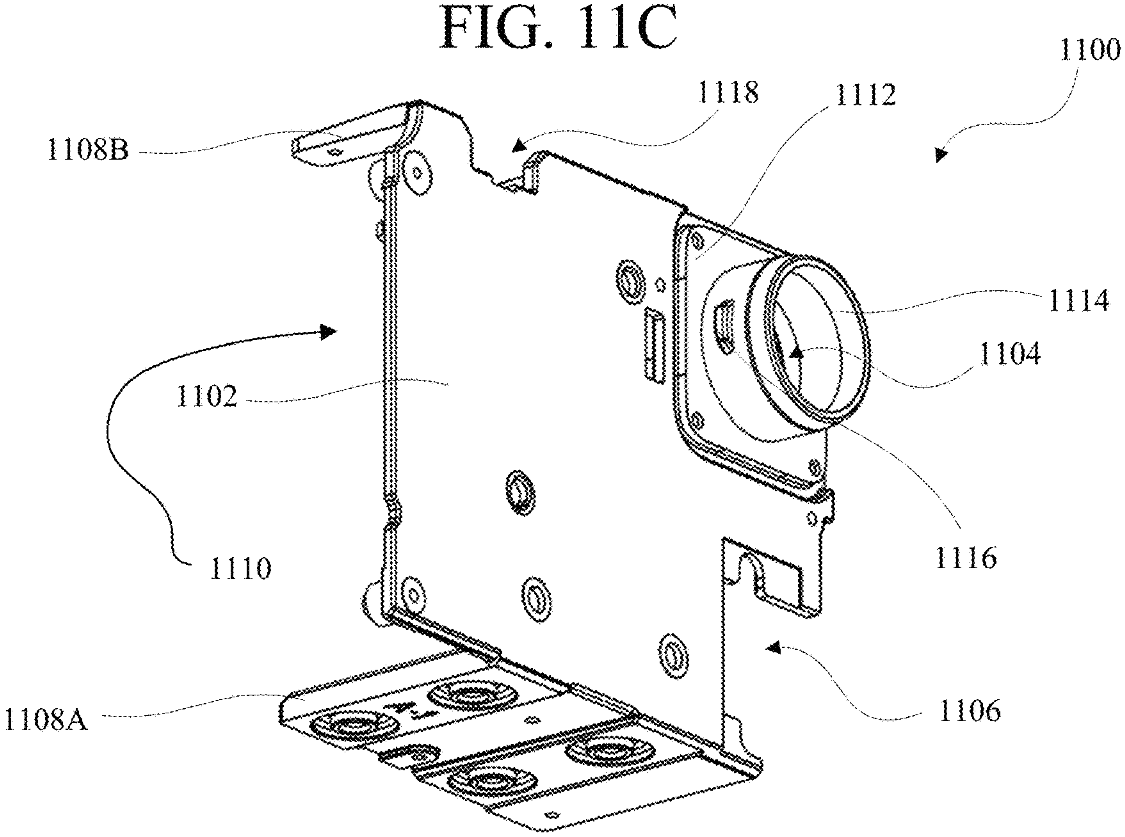
FIG. 11D is a front isometric view of the heatsink of FIG. 11C from a second side.

FIG. 11C is a front isometric view of a monolithic front heatsink 1100 from a first side and FIG. 11D is a front isometric view of the monolithic front heatsink 1100 of FIG. 11C from a second side. The front heatsink 1100 may be one monolithic piece. The front heatsink 1100 may be more than one piece of material that is integrally connected together so that a single monolithic piece is formed. The front heatsink 1102 may have two or more pieces connected together by a permanent fastening connection such as welding, friction welding, melting, or a combination thereof. The front heatsink may be free of screws, fasteners, nuts, bolts, threaded members, nails, rivets, pins, or a combination thereof. The front heatsink 1100 may be a single solid piece of material. The front heatsink 1100 may be made of a thermally conductive material. The front heatsink may be made of or include aluminum, copper, silver, nickel, iron, titanium, or a combination thereof. The front heatsink 1100 includes a planar surface 1102.

The planar surface 1102 may be connected to an exterior surface of the image capture apparatus/device 100, 200, 300, 400, or 700 of FIGS. 1-4 and 7A-7C. The planar surface 1102 on a front side may contact one or more external heatsinks, one or more displays, or both. The planar surface 1102 may be located adjacent to a recess 1104 (e.g., an ISLA recess).

The ISLA recess 1104 may receive all or a portion of an image sensor and lens assembly (ISLA). A portion of the ISLA may be located on a first side of the ISLA recess 1104 and a second portion may extend into and at least partially through the ISLA recess 1104. The ISLA recess 1104 may be a through hole in the front heatsink 1100. The ISLA recess 1104 may be complementary in shape with the ISLA. The ISLA recess 1104 may extend forward relative to the planar surface 1102 of the front heatsink 1100. The ISLA recess 1104 may be located adjacent to a microphone recess 1106.

The microphone recess 1106 may function allow a microphone to pass through and/or around the front heatsink 1100 so that sound may be captured by a microphone located therein. The microphone recess 1106 may be a through hole within the front heatsink 1100. The microphone recess 1106 may be lack of material or an absence of material within the front heatsink 1100. The microphone recess 1106 may be an area of the front heatsink 1100 where no material may be present so that the microphone may extend toward an exterior of the image capture device. The microphone recess 1106 may be a substantially square area through the front heatsink 1100. The microphone recess 1106 may permit attachment of a microphone to the front heatsink 1100. The microphone recess 1106 may be located adjacent to, above, or both with respect to one more of the mounting flanges 1108.

The mounting flanges 1108 may include a bottom microphone flange 1108A, first top microphone flange 1108B, a second top microphone flange 1108C, or a combination thereof. The mounting flanges 1108A, B, C may project outward away from the planar surface 1102. The mounting flanges 1108A, B, C may extend at a right angle relative to the planar surface 1102. The mounting flanges 1108A, B, C may connect the front heatsink 1100 within an image capture device so that heat may be distributed by the front heatsink 1100. The mounting flanges 1108A, B, C may extend parallel to a top of the image capture device, a bottom of the image capture device, or both. The mounting flanges 1108A, B, C may be connected to or support one or more components that may be in communication with component contacts 1110 on a rear surface of the planar surface.

The component contacts 1110 function to assist in transferring thermal energy from heat producing components into the front heatsink 1100. The component contacts 1110 maybe made of the same material as the front heatsink 1100. The component contacts 1110 may be made of or include a thermal interface material (TIM), graphite, graphene, a thermal adhesive, or a combination thereof. The component contacts 1110 may be located on an opposite side of front heatsink 1100 as the connection mechanism 1112.

The connection mechanism 1112 functions to permit an ISLA to be connected to the front heatsink 1100, a removable cover lens 710 to be connected to the front heatsink 1100, or both. The connection mechanism 1112 may permit a removable cover lens 710 to be added and removed from the image capture apparatus, the front heatsink 1100, or both. The connection mechanism 1112 may be a bayonet. The connection mechanism 1112 and the planar surface 1102 may be made of a same material, be a unitary piece of material, or both. The connection mechanism 1112 may be part of the planar surface 1102 and may be connected without any fasteners or another connection mechanisms. For example, the connection mechanism 1112 may be formed when the planar surface 1102 is formed so that the front heatsink 1100 including the connection mechanism 1112 are one monolithic piece. The connection mechanism 1112 may be formed into the front heatsink 1100. The connection mechanism 1112 may include a protrusion 1114.

The protrusion 1114 functions to extend outward from the front heatsink 1100. The protrusion 1114 may be a structure that extends outward along an optical axis. The protrusion 1114 may have an interior that all or a portion of an ISLA may extend through. The protrusion 1114 may support the ISLA. The protrusion 1114 may extend outward from the planar surface 1102. The protrusion 1114 may be complementary in shape to the ISLA. The protrusion 1114 may be cylindrical. The protrusion 1114 may have an open interior. The interior of the protrusion 1114 may be substantially smooth, free of connections, or both so that the ISLA may extend through the protrusion 1114 without connecting directly to the protrusion. An exterior of the protrusion 1114 may include one or more connection projections 1116.

The connection projections 1116 may permit removable cover lenses such as lens 710 to be connected and disconnected from the front heatsink 1100. The connection projections 1116 may extend radially outward from protrusion 1114. The connection projections 1116 may be spaced apart from one another so that the removable cover lens may be connected and disconnected without any tools. The connection projections 1116 may form a rotational connection with the removable cover lens (e.g., lens 710). The connection projections 1116 may be a twist and lock feature, a tab, a detent, a threaded feature, a recess, a snapping feature, a locking feature, or a combination thereof. The connection projections 1116 may be located about 180 degrees or less, about 150 degrees or less, about 135 degrees or less, about 115 degree or less, about 90 degrees or less apart. The connection projections 1116 may be located about 35 degrees or more, about 60 degrees or more, or about 75 degrees or more apart. The connection projections 1116 may be a unitary part of protrusion 1114, the front heatsink 1100, or both. The connection projections 1116 may be formed into the protrusion 1114. The connection projections 1116 may assist in a lens 710 being connected relative to a light recess 1118.

The light recess 1118 function to permit light to pass through and/or around the front heatsink 1100. The light recess 1118 may be a through hole, an absence of material, a cutout, or a combination thereof in the front heatsink 1100. The light recess 1118 may be complementary in shape to a light. The light recess 1118 may be square, rectangular, oval, circular, a geometric shape, a non-geometric shape, or a combination thereof. The light recess 1118 may support a light, be free of contact with a light, permit a light to extend therethrough, or a combination thereof.

Figure 11E:
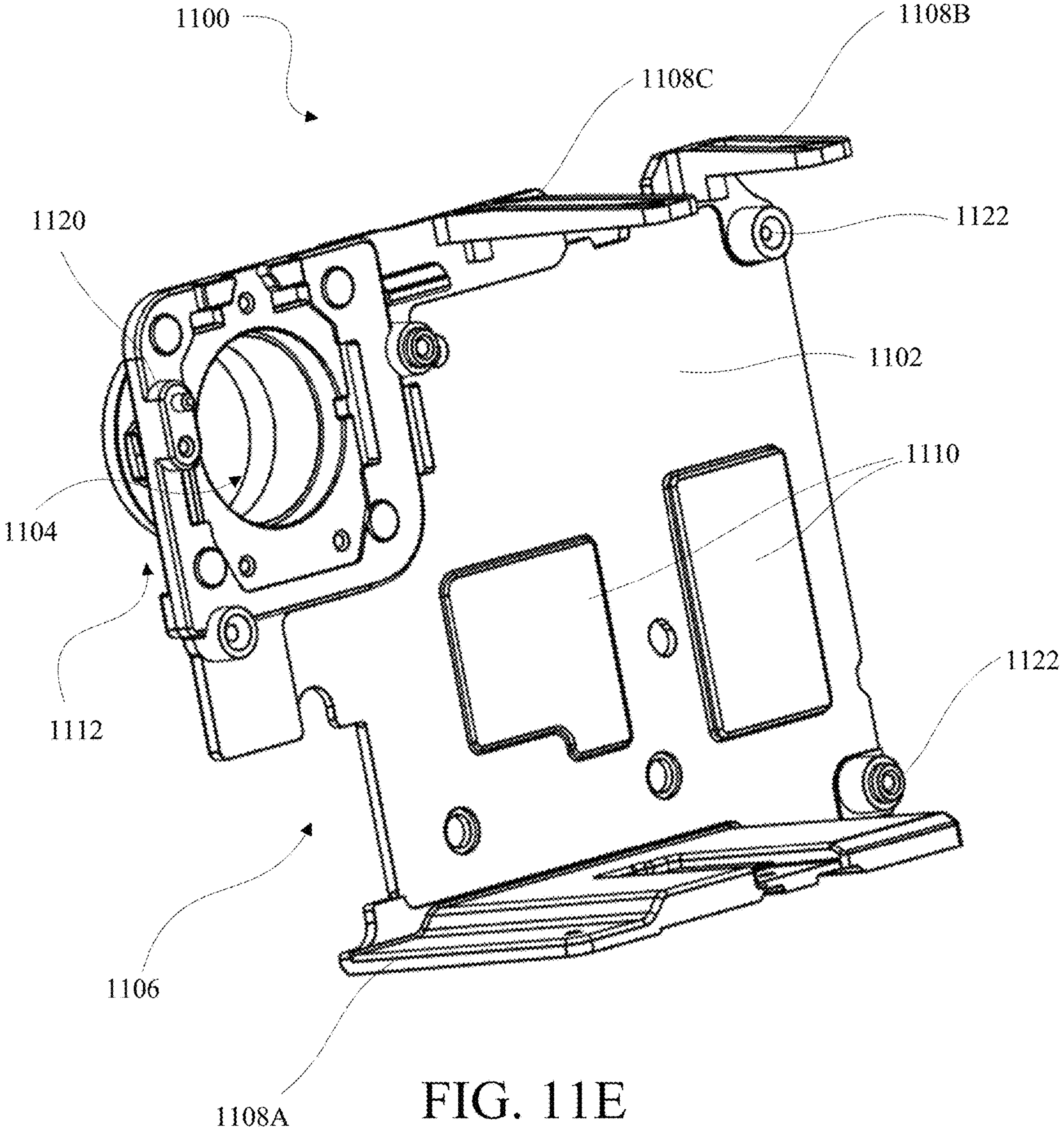
FIG. 11E is rear isometric view of the heatsink of FIG. 11C.

FIG. 11E is a rear isometric view of the monolithic front heatsink 1100 of FIGS. 11C-11D. As shown, the connection mechanism 1112 is uniformly formed within the front heatsink 1100. The connection mechanism 1112 extends away from the planar surface 1102. An ISLA may be connected directly to a rear surface or a front surface of the connection mechanism 1112. The connection mechanism 1112 may receive one or more fasteners. The fasteners may extend into the front heatsink 1100 from the front surface to the rear surface or vice versa.

The planar surface 1102 of the front heatsink 1100 may include one or more component contacts 1110. The component contacts 1110 may be a formed on the planar surface 1102 such that the component contacts 1110 extend outward from the planar surface 1102. The component contacts 1110 may be a raised surface. The component contacts 1110 may be an increase in mass at a location where the front heatsink 1100 is in contact with a heat producing component. The component contacts 1110 may be a monolithic part of the front heatsink 1100. The component contacts 1110 may in communication with a thermal paste, a TIM, or some other component that permits thermal energy from being passed from the heat producing component to the front heatsink 1100. The connection mechanism 1112 may include one or more shield interfaces 1120.

The shield interfaces 1120 function to connect one or more or more shields within the image capture apparatus. The shield interfaces 1120 may be located adjacent to where the ISLA extends through the front heatsink 1100, such as adjacent to the ISLA recess 1104. The shield interfaces 1120 may assist in connecting a shield that may prevent EMF from extending from the ISLA or to the ISLA, in other words, one or more EMF shields. The shield interfaces 1120 may hold or locate the EMF shields at a predetermined location. The shield interfaces 1120 may hold the EMF shields so that the EMF shields extend around one or more sides, two or more sides, three or more sides, four or more sides, or a combination thereof with respect to the ISLA recess 1104. The shield interfaces 1120 may be located adjacent to or along sides of the ISLA recess 1104. The shield interfaces 1120 may be located adjacent to or include one or more bosses 1122.

The bosses 1122 function to connect the front heatsink 1100 within an image capture apparatus, other components to the front heatsink 1100, or both. The bosses 1122 may connect the front heatsink 1100 to a first printed circuit board, a second printed circuit board, or both. The bosses 1122 may receive fasteners that may space apart components within the image capture apparatus. The bosses 1122 may extend directly into one or more components so that the components and the front heatsink 1100 are in direct contact. For example, a printed circuit board may include a through hole and a boss 1122 may extend through the through hole. The bosses 1122 may be in communication with spacers that fix components within an interior of the image capture apparatus. The bosses 1122 may receive one or more screws so that the front heatsink 1100 may connect to components, a housing of the image capture apparatus, or both.

Figure 12A:
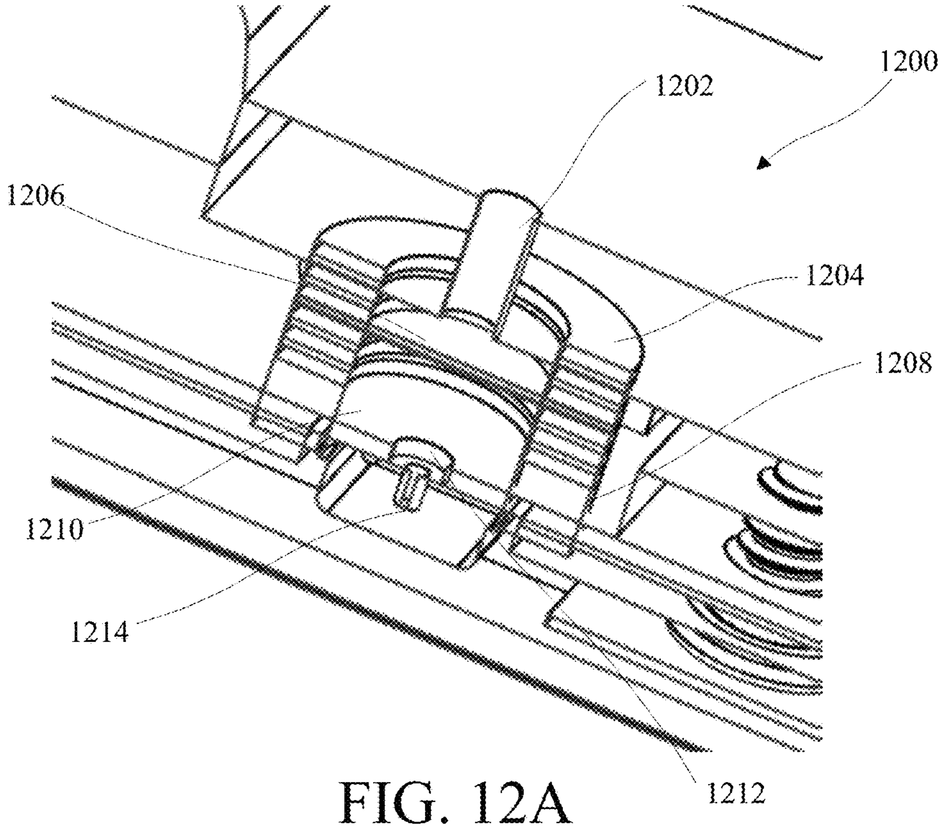
FIG. 12A is an isometric cross-sectional view of a microphone and sealing of the microphone.

FIG. 12A is an isometric cross-sectional view of a sealed microphone 1200. The sealed microphone 1200 includes a microphone hole 1202 through the housing that permits sound to pass towards the sealed microphone 1200. The microphone hole 1202 may be a through hole. The microphone hole 1202 may be sufficiently large for sound to pass freely through the housing. The microphone hole 1202 may restrict water from passing through the microphone hole 1202. The microphone hole 1202 may be surrounded by forward seals 1204.

The forward seals 1204 may be in contact with a rear side of the housing. The forward seals 1204 may be free of contact with the housing. The forward seals 1204 may be connected to the housing by a connector. The connector may be a mechanical connector or a chemical connector. The forward seals 1204 may be connected via adhesives. The forward seals 1204 may have an annular shape. The forward seals 1204 may be compressible, rigid, foam, expandable, fluid resistant or a combination thereof. The forward seals 1204 may be one or more seals, two or more seals, or three or more seals that are connected together. All of the forward seals 1204 may be substantially a same size, shape, thickness, diameter, or a combination thereof. The forward seals may be connected to a membrane 1206.

The membrane 1206 may allow sound to pass therethrough while preventing fluids from passing. The membrane 1206 may be made of or include an elastomer, plastic, a polymer, a composite material, a flexible material, a material that is elastically deformable, or a combination thereof. The membrane 1206 may be held taught by the forward seals 1204 and rearward seals 1208. The membrane 1206 may vibrate with sound.

The rearward seals 1208 may extend between the membrane 1206 and a printed circuit board 1210. The rearward seals 1208 and the forward seals 1204 may have a same size, shape, thickness, dimeter, material, material characteristics, or a combination thereof. The rearward seals 1208 may be connected to the membrane 1206 and the printed circuit board 1210 via a connector. The connector may me a mechanical connector or a chemical connector. The rearward seals 1208 may be connected by adhesives. The forward seals 1208 may be compressible, rigid, fluid tight, compressible, expandable, or a combination thereof. The rearward seals 1208 may connect to the printed circuit board 1210 via an adhesive.

The printed circuit board 1210 may be any printed circuit board 1210 that connects components, powers components, or both. The printed circuit board 1210 may include a PCB hole 1212.

The PCB hole 1212 may allow sound to pass through the printed circuit board into the microphone 1214. The PCB hole 1212 may be aligned with the microphone hole 1202. The PCB hole 1212 may extend a thickness of the printed circuit board 1210. The PCB hole 1212 may align with and direct sound into the microphone 1214.

The microphone 1214 may collect sound during capturing images, videos, or both. The microphone 1214 may be any microphone that captures sound.

Figure 12B:
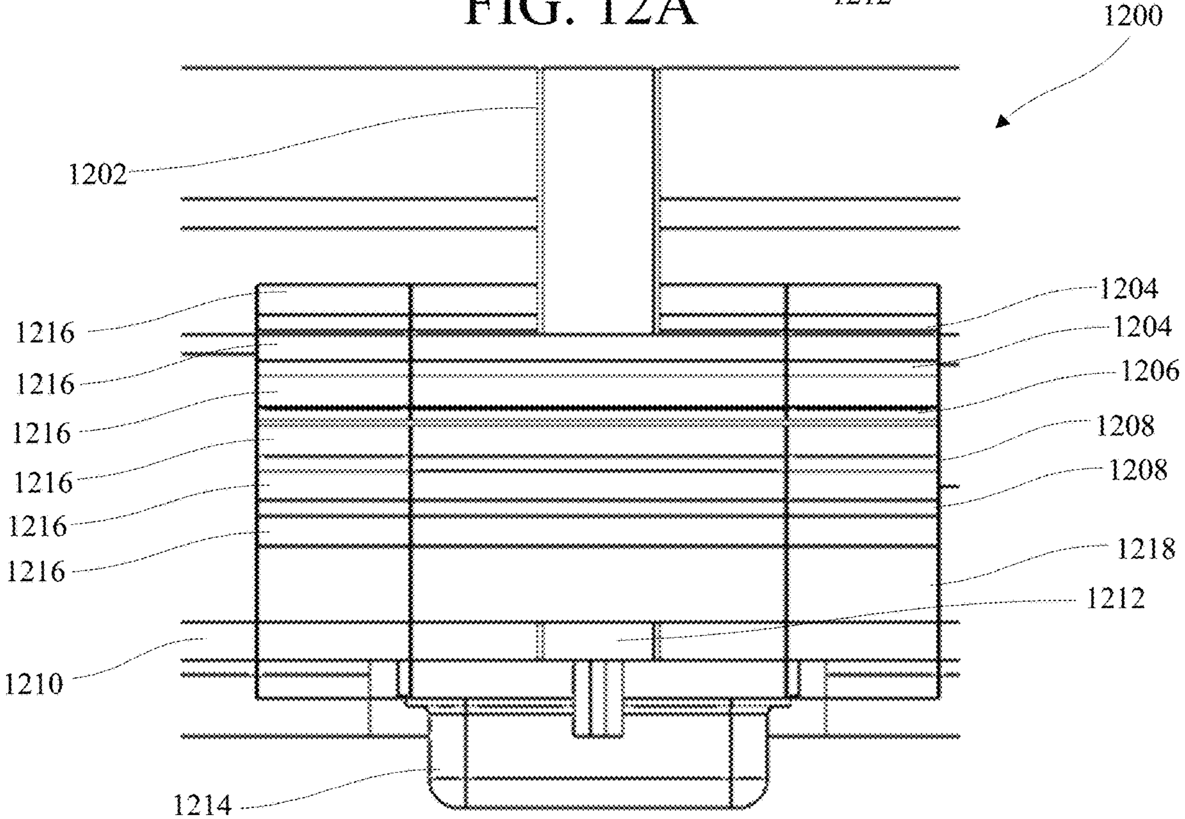
FIG. 12B is a front view of the isometric cross-sectional view of the sealing of the microphone of FIG. 12A.

FIG. 12B is plan view of the sealed microphone 1200 of FIG. 12A. The sealed microphone 1200 is located behind the microphone hole 1202 hole in the housing. A connector 1216 connects a forward seal 1204 to the housing around the microphone hole 1202. A first of the forward seals 1204 is connected to a second of the forward seals 1204 with a second connector 1216. A rear side of the second of the forward seals 1204 is connected to the membrane 1206 via another connector 1216. A rear side of the membrane 1206 is connected to a first rearward seal 1208 by a connector 1216. A second rearward seal 1208 connects to a rear seal 1218 by another connector 1216. The rear seal 1218 is connected to the printed circuit board 1210.

The connector 1216 may be a mechanical connector or a physical connector. The connector 1216 may connect by melting, heat staking. friction, glue, adhesive, bonding, or a combination thereof. The connector 1216 may be a pressure sensitive adhesive (PSA). The connector 1216 may create a sealed connection. The connector 1216 may be free of expansion or contraction. The connectors 1216 may connect two parts together. The connectors 1216 may be double sided tape. The connectors 1216 may maintain a connection if the seals 1204, 1208, and 1218 expand and contract. The connectors 1216 may connect around the PCB hole 1212 to prevent fluids from contacting the microphone 1214 and the suspend the membrane 1206 between the microphone hole 1202 and the PCB hole 1212.

Figure 13:
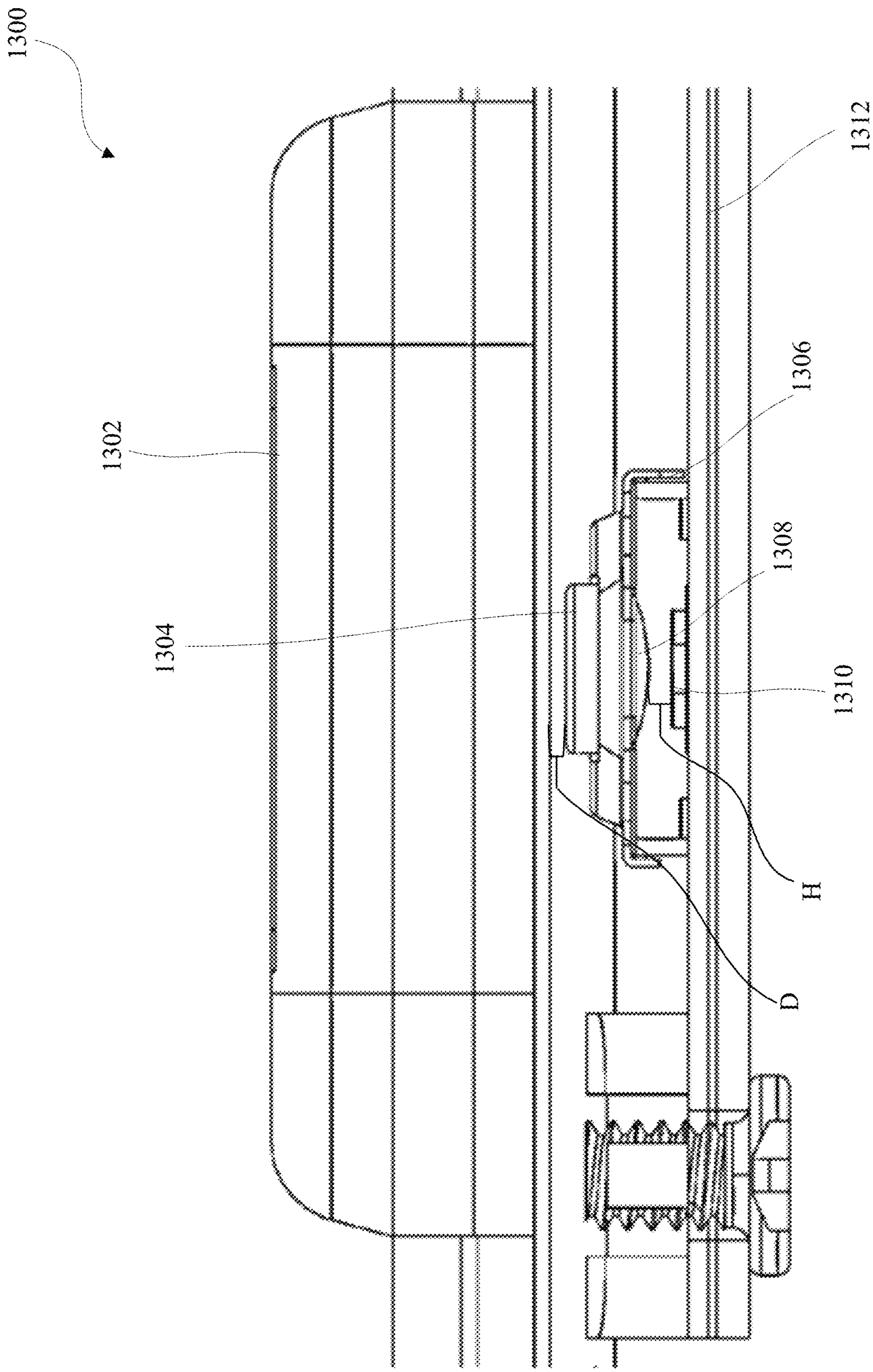
FIG. 13 is a cross-sectional view of a button configured to control a feature of the image capture device.

FIG. 13 is a cross-sectional view of a button 1300. The button 1300 includes a button housing 1302 that forms an outside of the button 1300. The button housing 1302 may be made of or include a polymer, rubber, an elastomeric material, silicone, or a combination thereof. The button housing 1302 may be elastically deformable. The button housing 1302 may have some rigidity. For example, the button 1300 may provide some resistance to outside forces such as water pressure. The resistance to deform the button housing 1302 may be about 1 N or more, 2 N or more, 5 N or more, 7 N or more, or about 10 N or more. The resistance to deform the button housing 1302 may be about 30 N or less, 25 N or less, 20 N or less, 15 N or less, or about 10 N or less. The button housing 1302 may be sufficiently rigid that the button housing 1302 may not be deformed by a column of water of about 5 m or less, about 7 m or less, about 10 m or less, about 15 m or less, or about 20 m or less. Stated another way, the button housing 1302 may resist the weight of the water until a depth is reached where the weight of the water overcomes the rigidity and then the button rigidity may be overcome where the button will be depressed by the weight of the water. The button housing 1302 when depressed will contact the interior button 1304.

The interior button 1304 may be sealed within the button housing 1302. The interior button 1304 may be actuated and upon actuation may not trigger a response until the interior button 1304 moves a distance (H). The interior button 1304 may be a middle piece in generating an actuation. The button housing 1302 may be moved the distance (D) into contact with the interior button 1304 and then the interior button 1304 may be moved relative to the button housing 1306. The interior button 1304 may then be moved a distance (H) so that a contact member 1308 of the interior button 1304 contacts a switch 1310 to actuate the switch 1310. The interior button 1304 may require a force to be moved. The interior button 1304 may require a similar force to that of the button housing 1302, the forces and rigidity discussed above regarding the button housing 1302 are incorporated herein regarding the interior button 1304. The interior button 1304 may be retained within the button housing 1306.

The button housing 1306 may be an elevated support for the interior button 1304. The button housing 1306 may create the height (H). The button housing 1306 may be rigid and inflexible. The button housing 1306 may allow a portion of the interior button 1304 to move and a portion of the interior button 1304 to remain substantially static. The portion of the interior button 1304 that is movable is the contact member 1308.

The contact member 1308 is elastically deformable so that the contact member 1308 moves the height (H) into contact with the switch 1310. Upon contacting the switch 1310 the contact member 1308 retracts into an original position (as shown). The contact member 1308 may deform upon contact with the switch 1310 so that the switch 1310 is actuated. The contact member 1308 upon a force being removed may elastically deform away from the switch 1310.

The switch 1310 may be an electric device, a mechanical device, or both. The switch 1310 may be a load cell, a bias device, or both. The switch 1310 upon receiving a sufficient force may generate an electric signal to cause the image capture apparatus to take a picture, change mode, or perform some other function. The switch 1310 may be connected to or located on a printed circuit board 1312.

Figure 14A:
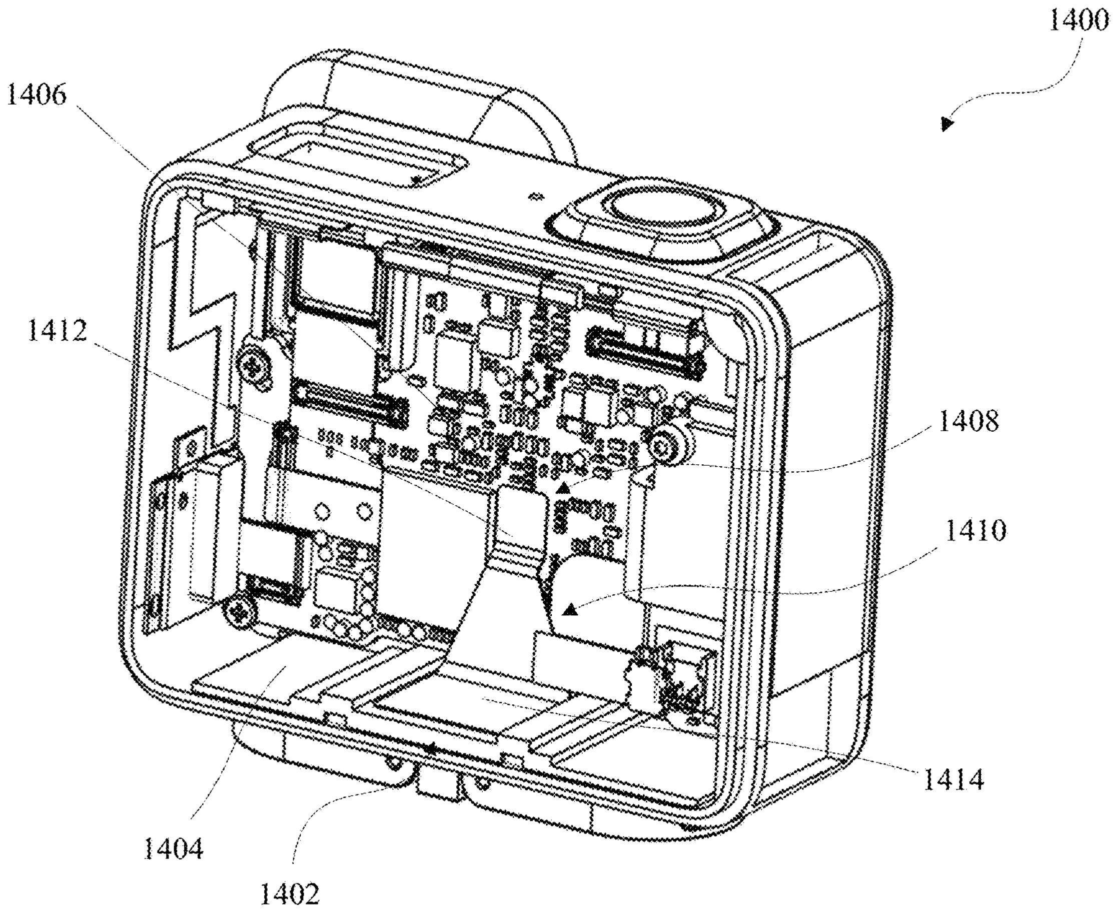
FIG. 14A is an isometric view of the image capture apparatus of FIGS. 7A-7C with a base heat spreader connected to a base of the front heatsink of FIGS. 11A-11B.

FIG. 14A illustrates a rear isometric view of an image capture apparatus 1400. The image capture apparatus 1400 has the rear removed so that an interior including internal components are exposed. The interior includes a front heatsink 1402 such as the front heatsinks shown in FIGS. 8 and 11A-11B. The front heatsink 1402 includes a base 1404 that extends along a base of the image capture apparatus 1400. The base 1404 extends along a bottom surface of the image capture apparatus 1400 may be indirectly or directly connected to the bottom surface of the image capture apparatus 1400. The base 1404 may assist in removing thermal energy from the image capture apparatus 1400. The base 1404 may direct heat in a second direction or along a second surface to distribute the thermal load toward an exterior of the image capture apparatus 1400. The base 1404 may extend under a printed circuit board 1406 (PCB) or in a direction away from the PCB 1406.

The PCB 1406 functions to power internal components. The PCB 1406 may include one or more components that generate thermal energy. The one or more components on the PCB 1406 that generate thermal energy may be or include a processor, a microprocessor, a sensor, or a combination thereof. The one or more components may be a graphics processor 1408.

The graphics processor 1408 may generate heat when the image capture apparatus 1400 is operating. The graphics processor 1408 may generate heat when images are being captured, images are being manipulated, images are being viewed, images are being stored, or a combination thereof. The graphics processor 1408 may be centrally located on the PCB 1406. The graphics processor 1408 may provide thermal energy. Thermal energy provided or generated by the graphics processor 1408 may be moved by a base heat spreader 1410.

The base heat spreader 1410 may extend from the graphics processor 1408 to the base 1404. The base heat spreader 1410 moves thermal energy from the graphics processor 1408 to the base 1404. The base 1404 assists in spreading the thermal energy from the graphics processor 1408 within the image capture apparatus 1400. The base heat spreader 1410 may be made of a same material as the other heat spreaders discussed herein. The base heat spreader 1410 directly connects to the graphics processor 1408 by a processor pad 1412.

The processor pad 1412 functions to directly remove thermal energy from a heat producing component (e.g., a graphics processor 1408). The processor pad 1412 may connect to the heat producing component by a thermal adhesive, a tape, a glue, a film, or a combination thereof. The processor pad 1412 may be substantially a same size and shape as the graphics processor 1408. The processor pad 1412 may directly attach to the graphics processor 1408 so that thermal energy produced by the graphics processor is moved to the base 1404. The thermal energy may move from the processor pad 1412 to front heatsink 1402 by the front heatsink pad 1414.

The front heatsink pad 1414 functions to transfer thermal energy into the base 1404 of the front heatsink 1402. The front heatsink pad 1414 may directly connect to the base 1404. The front heatsink pad 1414 may be connected by a thermal adhesive, a tape, a glue, a film, or a combination thereof. The front heatsink pad 1414 may be sufficiently large so that thermal energy is transferred around the image capture apparatus 1400 or out of the image capture apparatus 1400. The front heatsink pad 1414 may be larger than the processor pad 1412. The front heatsink pad 1414 may be larger than the processor pad 1412 by 2 times or more, 3 times or more, or even 4 times or more.

Figure 14B:
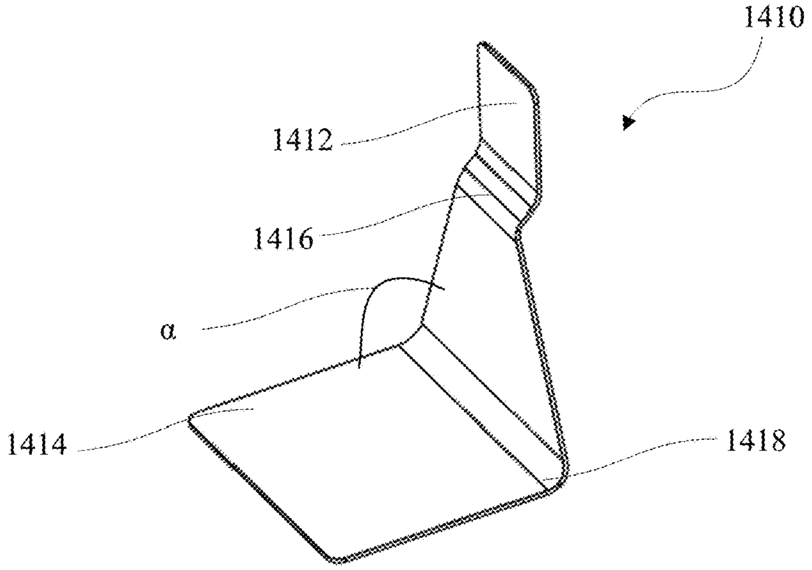
FIG. 14B is an isometric view of the base heat spreader.

FIG. 14B is an isometric view of the base heat spreader 1410 of FIG. 14A. The front heat spreader 1410 has a first end with the processor pad 1412 and a second end with the front heatsink pad 1414. A flex region 1416 is located adjacent to the processor pad 1412.

The flex region 1416 functions to permit movement of the base heat spreader 1410 so that the processor pad 1412 is movable out of a plane of the body into contact with a heat generating component. The flex region 1416 may include slits, cuts, perforations, folds, a break, or a combination thereof. The flex region 1416 may be a weakened area of the base heat spreader 1410. The flex region 1416 may be a portion that naturally flexes when a connection is formed. The flex region 1416 may allow a portion of the base heat spreader 1410 to move out of a plane of the body. The flex region 1416 may be located on an opposite end of the base heat spreader 1410 as an angle region 1418.

The angle region 1418 functions to permit the front heatsink pad 1414 to extend along a different plane then the processor pad 1412. The angle region 1418 may be formed in the base heat spreader 1410. The material of the angle region 1418 may be capable of bending or folding. The angle region 1418 may be a weakened area that allows the base heat spreader 1410 to move. The angle region 1418 may include slits, cuts, perforations, folds, breaks, or a combination thereof. The angle region 1418 may turn at an angle ($\alpha$) of about 15 degrees or more, about 30 degrees or more, about 45 degrees or more, about 60 degrees or more, about 75 degrees or more, or about 85 degrees or more. The angle region 1418 may turn at an angle ($\alpha$) of about 175 degrees or less, about 160 degrees or less, about 145 degrees or less, about 130 degrees or less, about 115 degrees or less, or about 105 degrees or less (e.g., about 90 degrees).

Figure 15A:
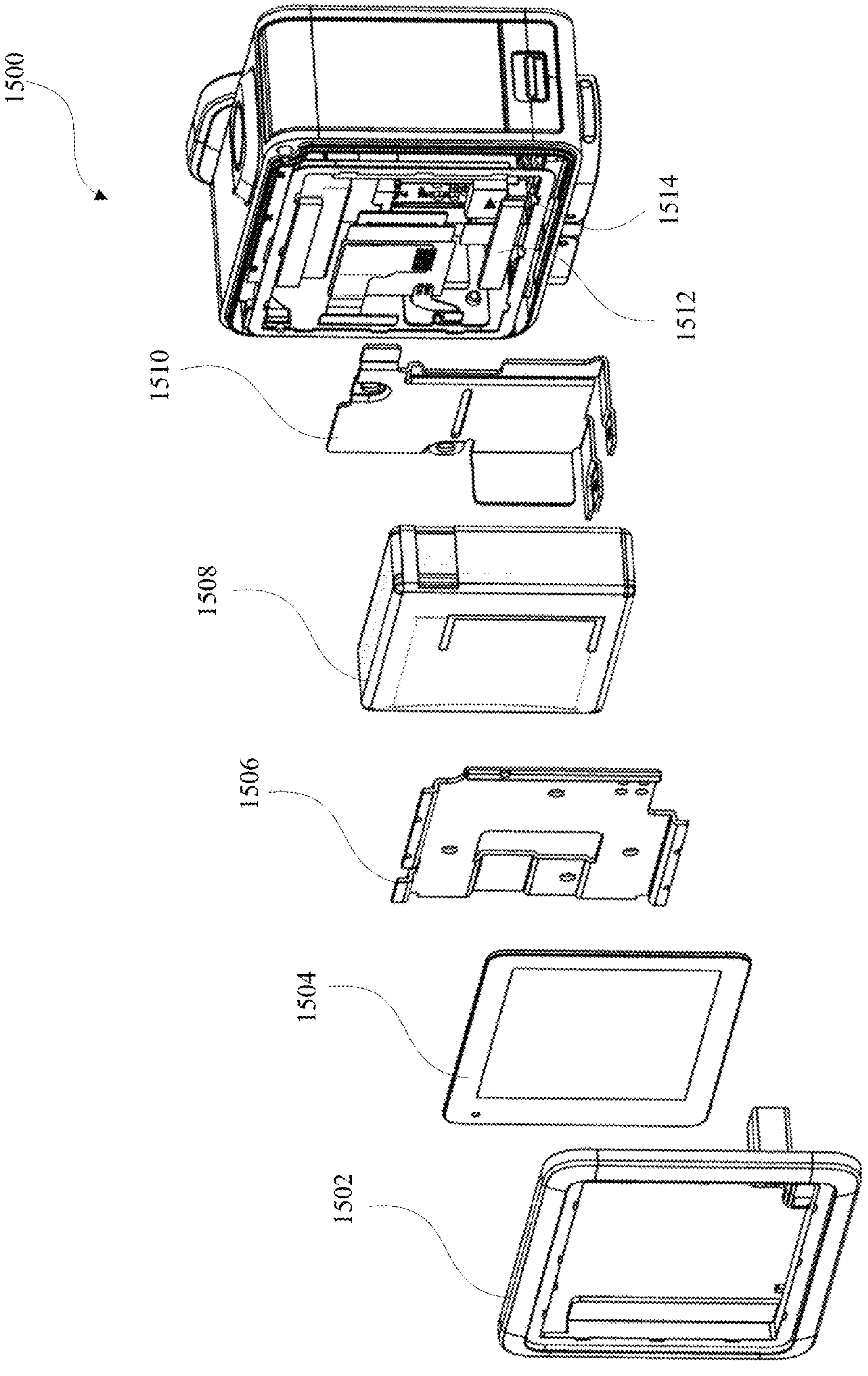
FIG. 15A is rear partially exploded view of an image capture apparatus that includes a LCD screen.

FIG. 15A is a rear partial exploded view of the image capture apparatus 1500. The image capture apparatus 1500 has a frame 1502 that surrounds all or a portion of a screen 1504. The screen 1504 may be a touch screen. The screen 1504 may be a liquid crystal display screen (LCD). The screen 1504 may substantially fill the rear side of the image capture apparatus 1500. The screen 1504 may be connected to or located proximate to a stiffener 1506.

The stiffener 1506 functions to prevent the screen 1504 from flexing, breaking, or both. The stiffener 1506 functions to remove thermal energy from the screen 1504. The stiffener 1506 may be made of a conductive material. The stiffener 1506 may be rigid. The stiffener 1506 may be metal. The stiffener 1506 may be connected to or located adjacent to a battery 1508.

The battery 1508 functions to power the image capture apparatus 1500, act as a heatsink, or both. The battery 1508 may be removable, fixed, or both. The battery 1508 may be a liquid cell, a dry cell, a lithium battery, a nickel battery, or a combination thereof. The battery 1508 may house thermal energy from the screen 1504 or other components. The battery 1508 may connect to a battery bracket 1510 on a side opposite the stiffener 1506.

The battery bracket 1510 may function to hold the battery 1508 within the image capture apparatus 1500. The battery bracket 1510 may spread thermal energy along the battery 1508. The battery bracket 1510 may assist in transferring thermal energy between a component and the battery 1508. The battery bracket 1510 may also act as a heatsink in addition to the battery 1508 being a heatsink. The battery bracket 1510 may be made of metal or some other thermally conductive material. The battery bracket 1510 may be in communication with one or more thermal interface materials (TIM) 1512.

The one or more TIMs 1512 may function to traverse or move thermal energy between two locations, spread thermal energy, or both. The one or more TIMs 1512 may connect to one or more heat producing components 1514 within the image capture apparatus 1500. The one or more TIMs 1512 may connect to a heat producing component 1514 at a first end and to a battery 1508, a heatsink (e.g., battery bracket 1510), or both at a second location along the TIMs 1512. The TIMs 1512 may be thermally conductive so that thermal energy from the heat producing components 1514 may be distributed around the image capture apparatus 1500.

The heat producing components 1514 may be any component within the image capture apparatus 1500 that generates thermal energy (e.g., heat) when the image capture apparatus 1500 is operating. The heat producing components 1514 may be processors, microprocessors, sensors, image sensors, screens, or a combination thereof. The heat producing components 1514 may be connected to a printed circuit board, powered by a printed circuit board, in communication with a printed circuit board, or a combination thereof.

Figure 15B:
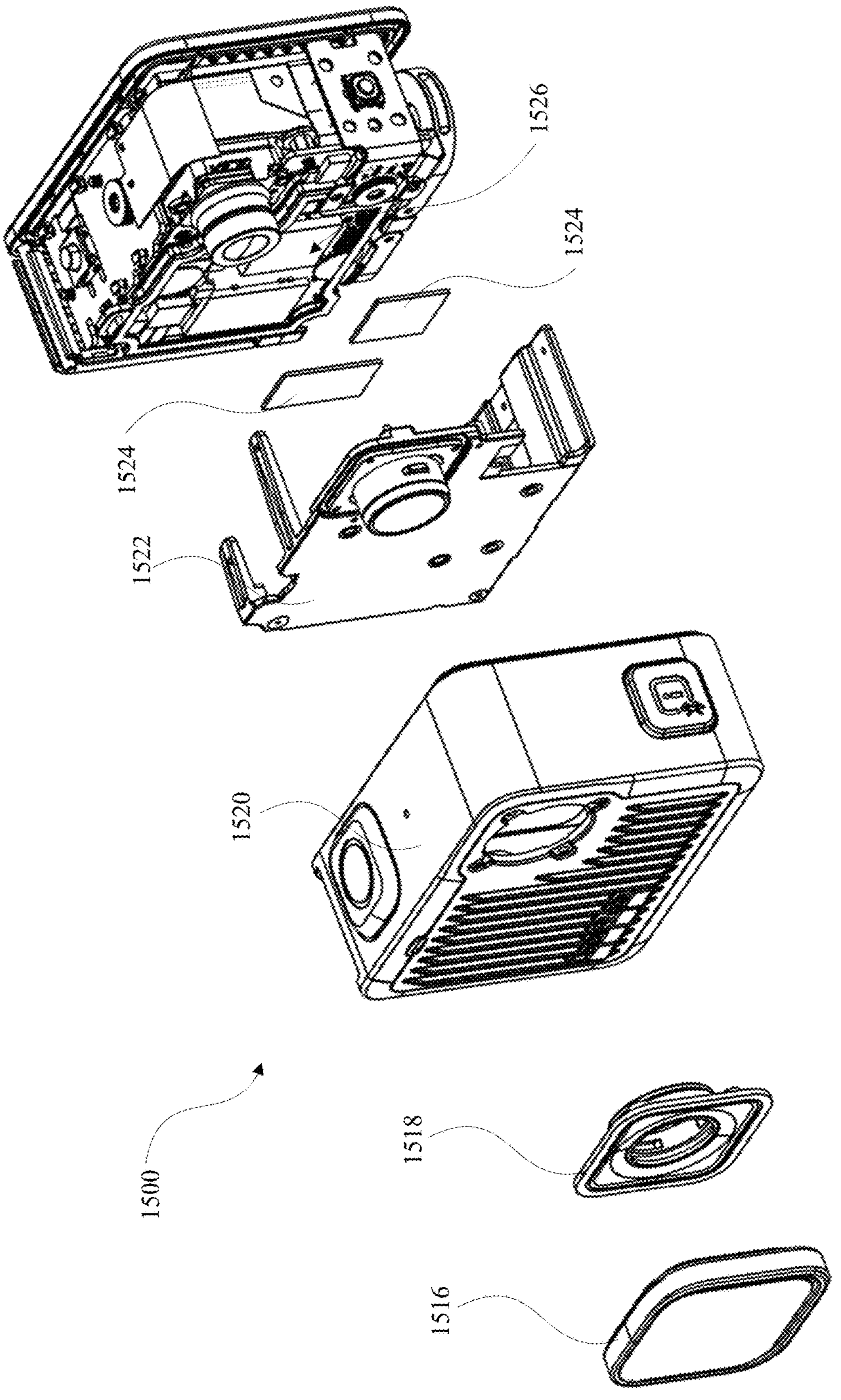
FIG. 15B is a front partially exploded view of the image capture apparatus of FIG. 15A.

FIG. 15B is a partial exploded view of a front of an image capture apparatus 1500. The image capture apparatus 1500 has a removable cover lens that includes a forward lens 1516 with a connection mechanism 1518 that connects to a forward housing 1520. The forward housing 1520 may be made of or include a rigid material, metal, plastic, an elastomer, rubber, or a combination thereof.

The forward housing 1520 may include a cavity that houses some or all of the components of the image capture apparatus 1500. The forward housing 1520 may be in communication with a forward heatsink 1522. Thermal energy may extend from the forward heatsink 1522 through the forward housing 1520. The forward heatsink 1522 may distribute the thermal energy across a front region of the forward housing 1520. The front heatsink 1522 may be the same as or similar to the front heatsinks 804, 1100, and 1402. The front heatsink 1522 may be in communication with a forward thermal interface material (forward TIM) 1524.

The forward TIM 1524 may provide heat transfer from a forward heat producing component 1526. The forward heat producing components 1526 may be any of the discussed herein as a heat producing component 1514.

The methods and techniques of the low profile image capture device described herein, or aspects thereof, may be implemented by an image capture apparatus, or one or more components thereof, such as the image capture apparatus 100 shown in FIGS. 1A-1B, the image capture apparatus 200 shown in FIGS. 2A-2B, the image capture apparatus 300 shown in FIG. 3, the image capture apparatus 400 shown in FIGS. 4A-4B, or the image capture apparatus 500 shown in FIG. 5. The methods and techniques of the low profile image capture device described herein, or aspects thereof, may be implemented by an image capture device, such as the image capture device 104 shown in FIGS. 1A-1B, one or more of the image capture devices 204, 206 shown in FIGS. 2A-2B, one or more of the image capture devices 304, 306 shown in FIG. 3, the image capture device 404 shown in FIGS. 4A-4B, or an image capture device of the image capture apparatus 500 shown in FIG. 5. The methods and techniques of processing images and electrically stabilizing images of the low profile image capture device described herein, or aspects thereof, may be implemented by an image processing pipeline, or one or more components thereof, such as the image processing pipeline 600 shown in FIG. 6.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An image capture apparatus, comprising:
- a monolithic front heatsink comprising:
  - a planar surface,
  - a connection mechanism located adjacent to the planar surface, wherein the connection mechanism comprises:
    - a protrusion, and
    - connection projections extending from the protrusion; and
- an image sensor and lens assembly (ISLA) coupled to the monolithic front heatsink and a portion of the ISLA extending through the protrusion of the monolithic front heatsink.

2. The image capture apparatus of claim 1, wherein the connection projections are configured to receive a removable cover lens so that the removable cover lens connects to the protrusion over the ISLA located within the protrusion.

3. The image capture apparatus of claim 2, wherein the connection mechanism and the planar surface are free of any fasteners or any device that connects the connection mechanism and the planar surface together.

4. The image capture apparatus of claim 1, wherein the connection mechanism is a bayonet that is configured to removably connect to a removable cover lens.

5. The image capture apparatus of claim 1, wherein the planar surface comprises one or more component contacts that are configured to transfer thermal energy from a heat producing component to the monolithic front heatsink.

6. The image capture apparatus of claim 1, further comprising:
- a microphone recess that is configured to allow sound to travel to a microphone located within the microphone recess.

7. The image capture apparatus of claim 1, wherein the planar surface includes a light recess and a light source or light from the light source is configured to extend through or around the planar surface.

8. An image capture apparatus, comprising:
- a front heatsink;
- an image sensor and lens assembly (ISLA) connected to and extending from the front heatsink so that the ISLA is fixed within the image capture apparatus relative to the front heatsink;
- a removable cover lens removably connected to the front heatsink forward of the ISLA; and
- a battery bracket in communication with the front heatsink so that thermal energy passes between the front heatsink and a battery in communication with the battery bracket,
- wherein the front heatsink comprises mounting flanges that extend outward relative to a surface connected to the ISLA, and
- wherein the battery bracket is in direct contact with one of the mounting flanges of the front heatsink.

9. The image capture apparatus of claim 8, wherein the front heatsink further comprises a connection mechanism that connects the removable cover lens to the front heatsink.

10. The image capture apparatus of claim 9, wherein the connection mechanism further comprises a projection with connection projections extending from the projection, and
- wherein the projection extends into the removable cover lens and the connection projections connect the removable cover lens to the front heatsink.

11. The image capture apparatus of claim 8, wherein the battery bracket comprises an opening and a battery pad extends through the opening in the battery bracket.

12. The image capture apparatus of claim 11, wherein the ISLA comprises an image sensor, and wherein the battery pad extends through the opening in the battery bracket to connect the image sensor to the battery.

13. The image capture apparatus of claim 8, wherein the mounting flanges comprise:

a bottom microphone flange that extends from a bottom edge of the heatsink, and a top microphone flange that extends from a top edge of the heatsink that is opposite the bottom edge.

14. The image capture apparatus of claim 8, wherein the heatsink comprises a component contact that is in contact with one or more components on a printed circuit board.

15. An image capture apparatus, comprising:

a front heatsink comprising:

mounting flanges with one of the mounting flanges comprising:

a base;

a planar surface;

a connection mechanism located adjacent to the planar surface, the connection mechanism comprising:

a projection that extends outward from the front heatsink in a direction opposite the mounting flanges;

a light recess located within the planar surface that allows light to pass through or around the front heatsink; and a microphone recess located within the planar surface and located adjacent to the connection mechanism so that sound is allowed to come into communication with a microphone located within the image capture apparatus.

16. The image capture apparatus of claim 15, wherein the projection further comprises connection projections that extend outward from the projection so that a removable cover lens is directly connected to the front heatsink.

17. The image capture apparatus of claim 16, further comprising:

bosses within the front heatsink that are configured to receive fasteners that support components within the image capture apparatus relative to the front heatsink.

18. The image capture apparatus of claim 15, further comprising:

a shield interface within the front heatsink that is configured to align one or more shields to an image sensor and lens assembly (ISLA) so that an image sensor of the ISLA is blocked from EMF.

19. The image capture apparatus of claim 18, wherein the ISLA is directly connected to the front heatsink so that the ISLA is supported within the image capture apparatus.

20. The image capture apparatus of claim 18, wherein the ISLA extends into the front heatsink through the projection and the shield interface is located adjacent to the projection on an opposite side of the front heatsink as the projection.

* * * * *